(12) United States Patent
Shinohara

(10) Patent No.: US 11,784,262 B2
(45) Date of Patent: Oct. 10, 2023

(54) PHOTOELECTRIC CONVERSION APPARATUS, RADIATION IMAGE CAPTURING SYSTEM, PHOTOELECTRIC CONVERSION SYSTEM, MOVING OBJECT

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/945,165

(22) Filed: Jul. 31, 2020

(65) Prior Publication Data
US 2021/0043781 A1 Feb. 11, 2021

(30) Foreign Application Priority Data
Aug. 7, 2019 (JP) .................................. 2019-145392

(51) Int. Cl.
*H01L 31/02* (2006.01)
*H01L 31/115* (2006.01)
(Continued)

(52) U.S. Cl.
CPC ...... *H01L 31/02005* (2013.01); *H01L 31/101* (2013.01); *H01L 31/115* (2013.01); *G01S 17/931* (2020.01)

(58) Field of Classification Search
CPC .............. H01L 31/02005; H01L 31/101; H01L 31/115; H01L 31/022416; H01L 31/102; G01S 17/931
See application file for complete search history.

(56) References Cited

U.S. PATENT DOCUMENTS

| 4,411,728 A * | 10/1983 | Sakamoto ......... H01L 21/02631 |
| | | 438/57 |
| 2003/0189656 A1* | 10/2003 | Shinohara .............. H04N 5/369 |
| | | 348/E3.018 |

(Continued)

FOREIGN PATENT DOCUMENTS

| JP | 2001-111020 A | 4/2001 |
| JP | 2005-322739 A | 11/2005 |

(Continued)

*Primary Examiner* — Sitaramarao S Yechuri
(74) *Attorney, Agent, or Firm* — CANON U.S.A., INC. IP Division

(57) ABSTRACT

An apparatus includes a first semiconductor region of a first conductivity type configured to collect a signal charge, and a connection region of a second conductivity type configured to feed a predetermined potential to a well including a second semiconductor region of the second conductivity type at a depth to which the connection region extends, a third semiconductor region of the second conductivity type at a position deeper than the connection region and the second semiconductor region, and a fourth semiconductor region between the second semiconductor region and the third semiconductor region, wherein a dopant for use in forming a semiconductor region of the first conductivity type is injected in the fourth semiconductor region, and a main carrier of the fourth semiconductor region is a carrier of the same conductivity type as a majority carrier of a semiconductor region of the second conductivity type.

31 Claims, 15 Drawing Sheets

(51) Int. Cl.
*H01L 31/101* (2006.01)
*G01S 17/931* (2020.01)

(56) References Cited

U.S. PATENT DOCUMENTS

| | | | |
|---|---|---|---|
| 2007/0122948 A1* | 5/2007 | Wei | H01L 27/14663 |
| | | | 257/E31.086 |
| 2008/0099868 A1* | 5/2008 | Sekiguchi | H01L 27/1463 |
| | | | 257/443 |
| 2009/0086066 A1 | 4/2009 | Itonaga | |
| 2014/0042507 A1 | 2/2014 | Iwata | |
| 2018/0108800 A1* | 4/2018 | Morimoto | B60W 30/00 |

FOREIGN PATENT DOCUMENTS

| | | |
|---|---|---|
| JP | 2008-263227 A | 10/2008 |
| JP | 2009-88286 A | 4/2009 |
| JP | 2014-36199 A | 2/2014 |
| JP | 2018-107409 A | 7/2018 |
| WO | 2018/185587 A1 | 10/2018 |

* cited by examiner

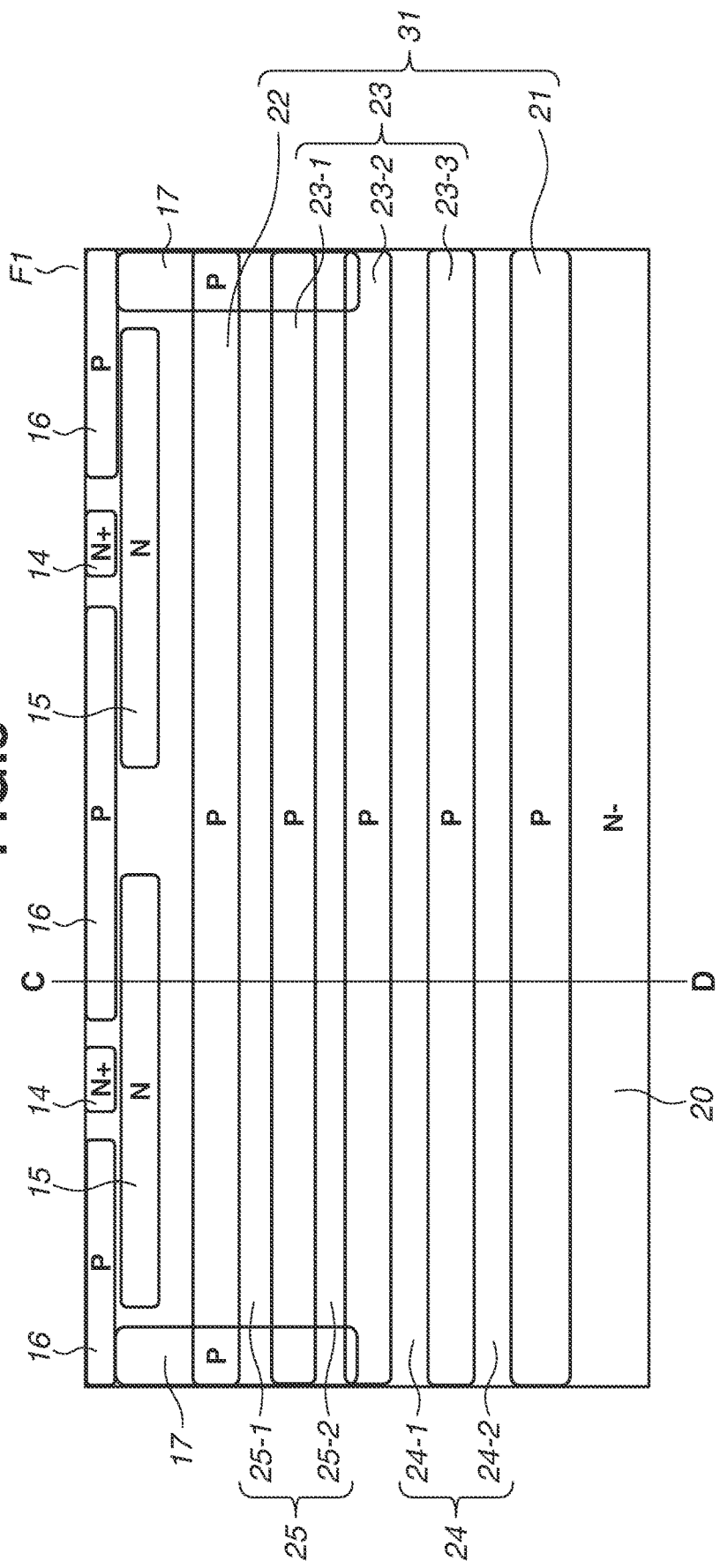

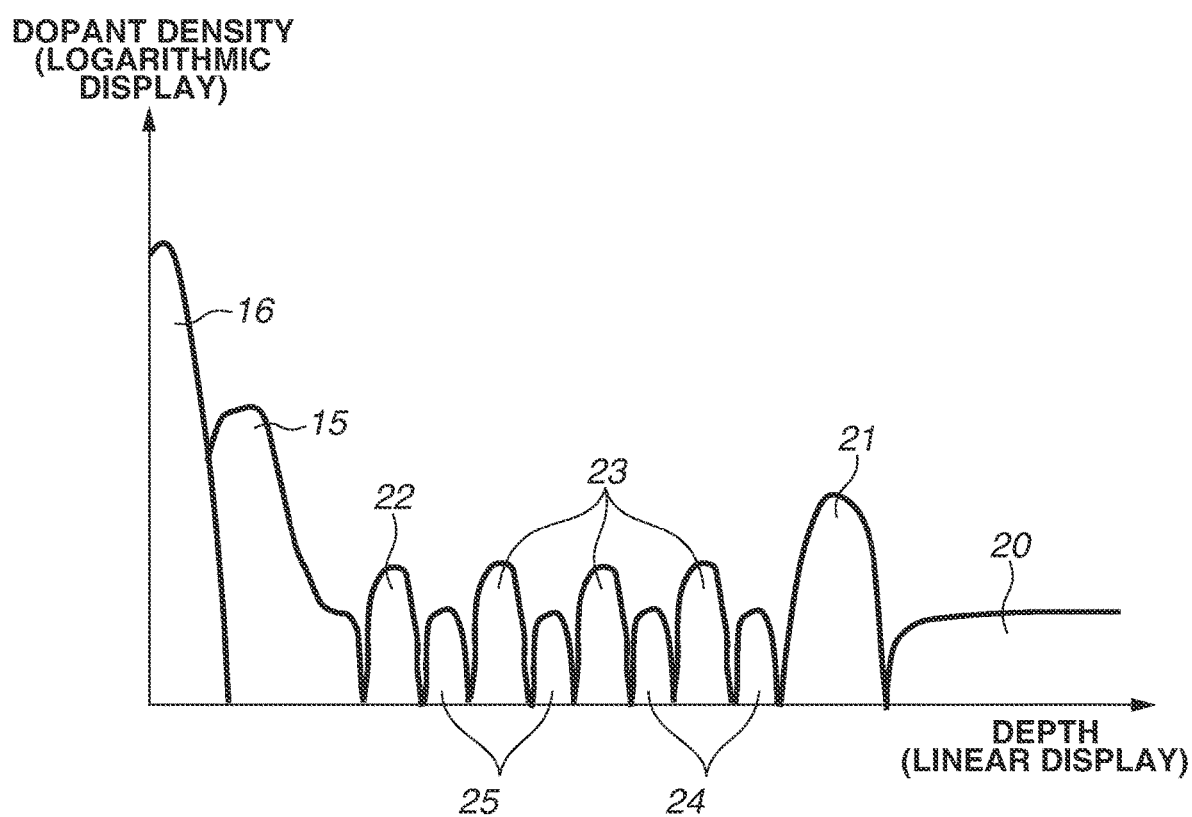

PHOTOELECTRIC CONVERSION APPARATUS, RADIATION IMAGE CAPTURING SYSTEM, PHOTOELECTRIC CONVERSION SYSTEM, MOVING OBJECT

BACKGROUND

Field of the Disclosure

The aspect of the embodiments relates to photoelectric conversion apparatuses, radiation image capturing systems, photoelectric conversion systems, and moving objects.

Description of the Related Art

A photoelectric conversion apparatus is known that includes a photoelectric converter configured to generate a signal charge by photoelectrically converting light.

Japanese Patent Application Laid-Open No. 2008-263227 discusses a configuration of a well in a photoelectric converter of a solid-state image capturing apparatus. The discussed configuration of the well increases efficiency in collecting signal charge generated by light, i.e., discusses a well structure of increased sensitivity.

SUMMARY

According to an aspect of the embodiments, an apparatus includes a semiconductor substrate including a first surface through which light enters, and the semiconductor substrate includes a first semiconductor region of a first conductivity type configured to collect a signal charge based on the light, a well at a position deeper than the first semiconductor region when viewed from the first surface, and a connection region of a second conductivity type extending from the first semiconductor region through a part of a well region in a depth direction of the semiconductor substrate and configured to feed a predetermined potential to the well, the second conductivity type being opposite to the first conductivity type, and the well includes a second semiconductor region of the second conductivity type at a depth to which the connection region extends, a third semiconductor region of the second conductivity type at a position deeper than the connection region and the second semiconductor region when viewed from the first surface, and a fourth semiconductor region between the second semiconductor region and the third semiconductor region wherein a dopant for use in forming a semiconductor region of the first conductivity type is injected in the fourth semiconductor region, wherein a main carrier of the fourth semiconductor region is a carrier of the same conductivity type as a majority carrier of the semiconductor region of the second conductivity type.

According to another aspect of the embodiments, an apparatus includes a semiconductor substrate including a first surface through which light enters, and the semiconductor substrate includes a first semiconductor region of the first conductivity type configured to collect a signal charge based on the light, a well at a position deeper than the first semiconductor region when viewed from the first surface, and a connection region of the second conductivity type extending from the first semiconductor region through a part of a well region in a depth direction of the semiconductor substrate and configured to feed a predetermined potential to the well, the second conductivity type being opposite to the first conductivity type, and the well includes a second semiconductor region of the second conductivity type at a depth to which the connection region extends, a third semiconductor region of the second conductivity type at a position deeper than the connection region and the second semiconductor region when viewed from the first surface, and a fourth semiconductor region between the second semiconductor region and the third semiconductor region wherein a dopant for use in forming a semiconductor region of the first conductivity type is injected in the fourth semiconductor region, wherein a width of the fourth semiconductor region in the depth direction of the semiconductor substrate is in the range from 0.8 times to 4 times a Debye length of the fourth semiconductor region.

Further features of the present disclosure will become apparent from the following description of exemplary embodiments with reference to the attached drawings.

BRIEF DESCRIPTION OF THE DRAWINGS

FIG. 3 illustrates an example of a configuration of a photoelectric converter.

FIG. 4 illustrates an example of a dopant density of a photoelectric converter.

DESCRIPTION OF THE EMBODIMENTS

A way to increase the sensitivity of a photoelectric converter is to further increase the depth of a well. However, in a case where the well has a deep depth, it is often difficult to give a potential to the well when the deep well is formed.

In one method, the well is formed with a potential gradient in the depth direction of the substrate to collect signal charge efficiently in a signal charge accumulation region. To increase the depth of the well, a method is sometimes employed in which the valence of an ion to be injected is increased to raise an acceleration energy in ion injection. However, there are technical difficulties in forming such a deep well showing an appropriate potential gradient.

A technique for forming the well showing the appropriate potential gradient while difficulties in a manufacturing process are reduced even in a case where the depth of the well is increased will be described below.

In each exemplary embodiment described below, mainly an image capturing apparatus will be described as an example of a photoelectric conversion apparatus. The exemplary embodiments are not limited to image capturing apparatuses and are also applicable to other photoelectric conversion apparatuses. Other examples of photoelectric conversion apparatuses include a distance measurement apparatus (apparatus for measuring a distance using focal point detection or time-of-flight (TOF)) and a photometric apparatus (apparatus for measuring an amount of incident light).

Further, semiconductor regions, conductivity types of a well, and injected dopants that are described in the below-described exemplary embodiments are mere examples and are not intended to limit the conductivity types and dopants to those described in the exemplary embodiments. Each conductivity type and dopant described in the exemplary embodiments can be changed as needed, and a semiconductor region and potential of a well are changed as appropriate based on the change.

A first exemplary embodiment will be described below with reference to the drawings.

Figure 1:
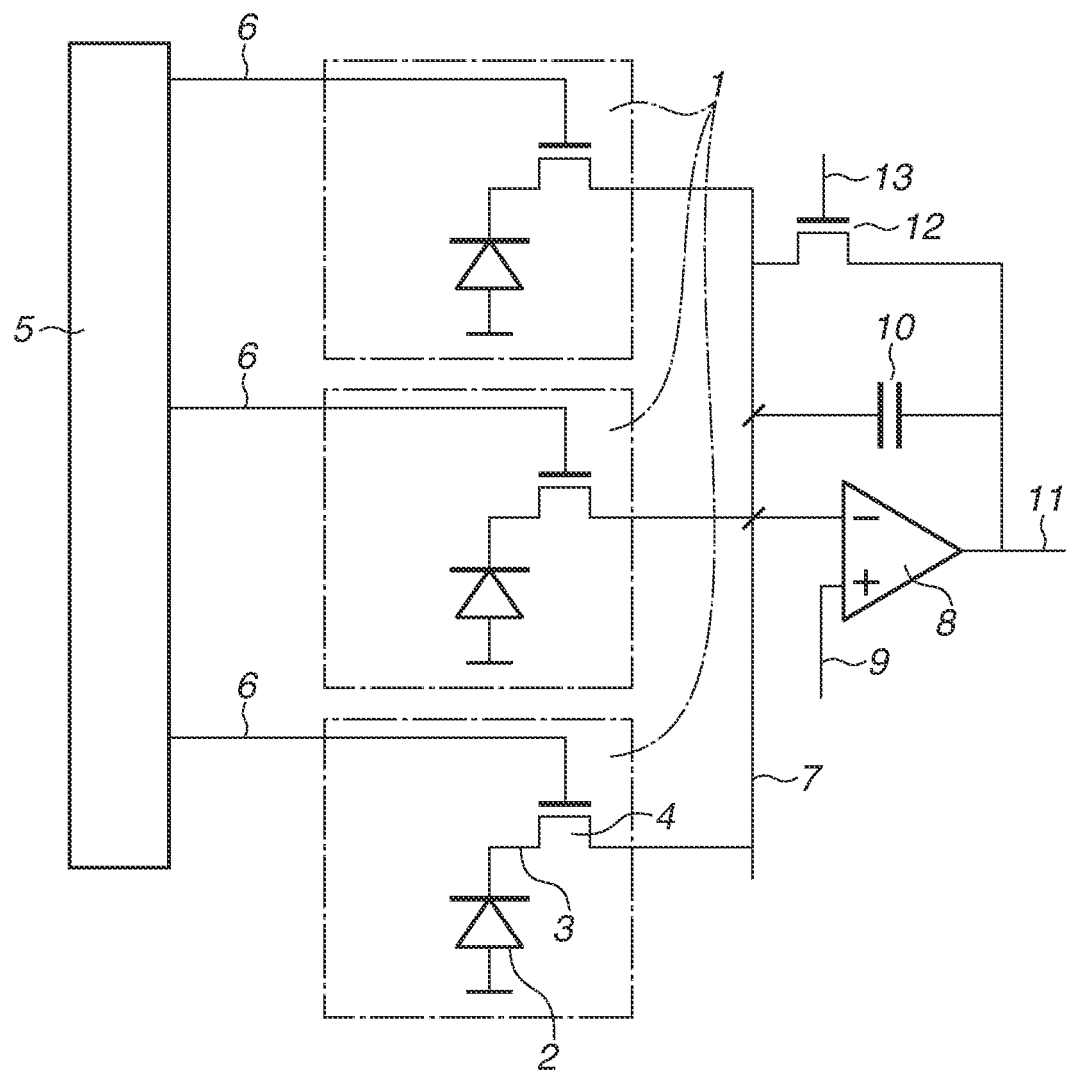
FIG. 1 illustrates an example of a configuration of a photoelectric conversion apparatus.

FIG. 1 is a circuit diagram illustrating a photoelectric conversion apparatus according to the present exemplary embodiment. In FIG. 1, three photoelectric conversion units 1 are illustrated. The photoelectric conversion unit 1 is also referred to as "pixel" in a case of an image capturing apparatus. The photoelectric conversion apparatus is not limited to this example and can include more photoelectric conversion units 1. Each photoelectric conversion unit 1 includes a photodiode (PD) 2, which is a photoelectric converter, a signal accumulation electrode 3, and a transistor 4. The transistor 4 is a metal oxide semiconductor (MOS) transistor that performs switching operations. The photoelectric conversion apparatus further includes a scan circuit 5. The scan circuit 5 feeds a control signal (pulse signal) to a gate electrode of the transistor 4 of each photoelectric conversion unit 1 via a wiring line 6. By the control signal, the transistor 4 is controlled to be turned on/off.

The photoelectric conversion apparatus further includes an amplifier 8. The amplifier 8 and each transistor 4 are connected via a signal output line 7. A predetermined potential Vref is fed to a non-inverting input node of the amplifier 8 via a wiring line 9. An output node of the amplifier 8 is connected to an output line 11. An integral capacitor 10 and a transistor 12 are provided on a feedback path between the output node and an inverting input node of the amplifier 8. The transistor 12 is controlled to be turned on/off by a control signal fed via a control line 13.

The amplifier 8 and the integral capacitor 10 form a charge integration circuit.

In a state where the transistor 12 is off, if the transistor 4 is turned on, the signal charge accumulated in the PD 2 are integrated by the integral capacitor 10. The signal corresponding to the signal charge integrated by the integral capacitor 10 is output to the output line 11. The potential of the signal output line 7 is virtually fixed to the potential Vref, so that when the signal charge of the PD 2 are read out, the PD 2 is reset to the potential Vref. Thereafter, in a state where the transistor 4 is on, the transistor 12 is turned on, so that the charge of the integral capacitor 10 are reset, and the output line 11 is changed to the potential Vref.

The scan circuit 5 sequentially turns on the transistors 4 of the photoelectric conversion units 1. Consequently, the signal charge accumulated in the PDs 2 of the photoelectric conversion units 1 are output.

Figure 2:
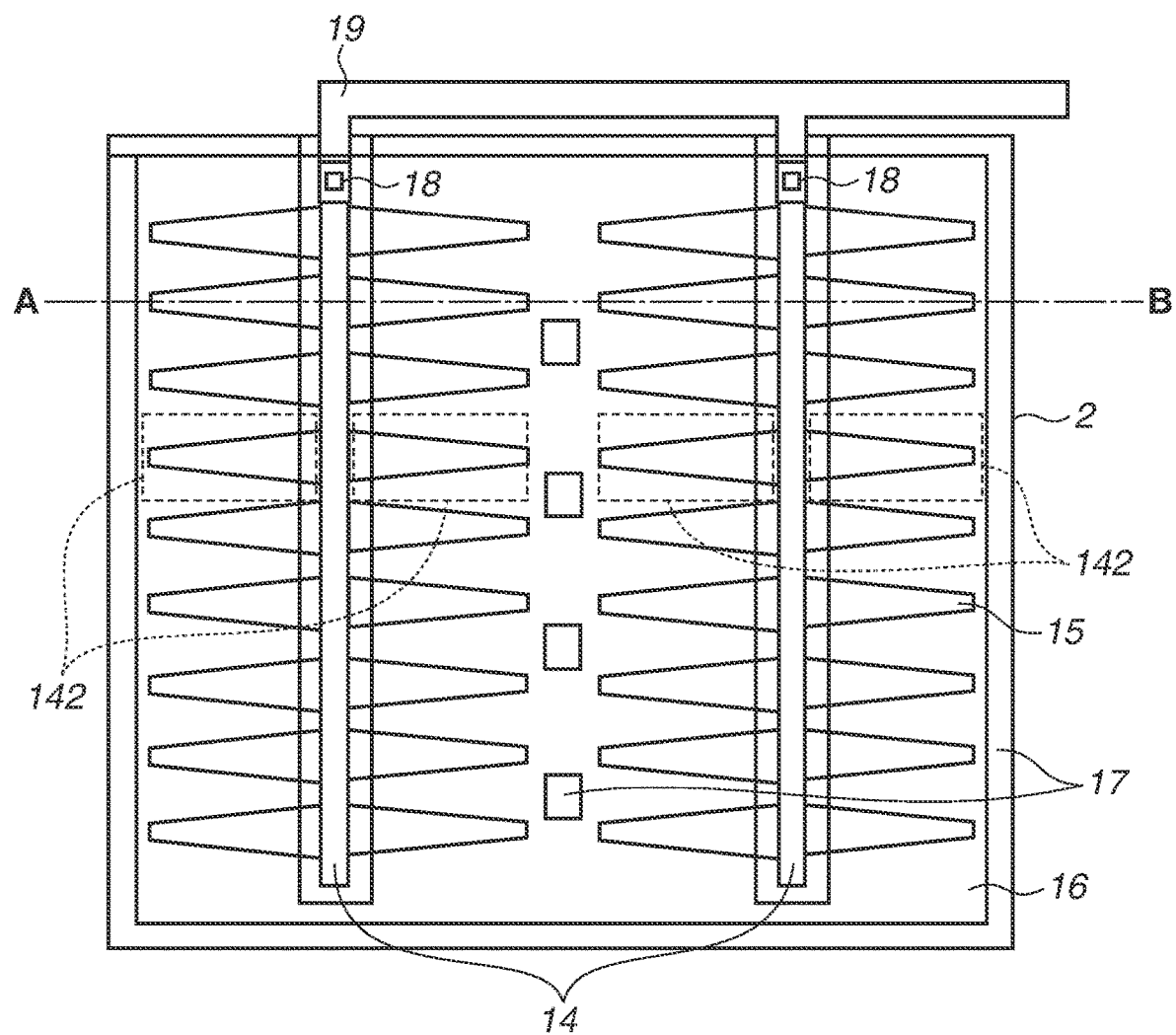
FIG. 2 illustrates an example of a configuration of a photoelectric converter.

FIG. 2 is the planar layout view illustrating the PD 2 in FIG. 1. FIG. 3 is the cross-sectional view along a line A-B indicated in FIG. 2. A configuration will be described below with reference to FIGS. 2 and 3. In FIGS. 2 and 3, each component similar to that in FIG. 1 is indicated by the same reference numeral as that in FIG. 1.

In FIG. 2, light enters the rectangular region indicated as the PD 2. The PD 2 includes an N-type semiconductor region 14 (first semiconductor region), which is the first conductivity type. The semiconductor region 14 is a collection region configured to collect signal charge generated by photoelectric conversion. The semiconductor region 14 extends along the first direction (lengthwise direction in FIG. 2) in the PD 2. The semiconductor region 14 is in contact with a front surface of a semiconductor substrate, which will be described below.

The trapezoidal, N-type semiconductor region 15 (seventh semiconductor region) is the semiconductor region located at the position deeper than the semiconductor region 14 when viewed from the incident surface F1, as illustrated in FIG. 3. The semiconductor region 15 is the buried accumulation region configured to accumulate signal charge generated by photoelectric conversion.

The N-type semiconductor regions 15 are provided corresponding to the two semiconductor regions 14, respectively. In the planar view, the semiconductor region 15 overlaps with the corresponding semiconductor region 14 and the P-type semiconductor region 16, which is of the second conductivity type opposite to the first conductivity type. Specifically, each semiconductor region 15 includes a trunk portion and a plurality of branch portions 142. In the planar view, the trunk portion is in a region that overlaps with the semiconductor region 14, whereas the plurality of branch portions 142 is in the region that overlaps with the semiconductor region 16. The plurality of branch portions 142 extends in comb-teeth shape from a trunk portion toward both directions parallel to the second direction (direction parallel to line A-B in FIG. 2) intersecting with the first direction. The width of each branch portion 142 decreases as the distance from the trunk portion becomes greater.

In the region of the PD 2 other than the semiconductor region 14 and its nearby regions, the P-type semiconductor region 16 (eighth semiconductor region) is provided contacting the front surface portion of the semiconductor substrate.

The semiconductor region 17 is located in a peripheral portion of the PD 2 and part of a central portion of the PD 2. The semiconductor region 17 electrically separates the plurality of the PD 2 from each other and electrically connects the semiconductor region 16 and the P-type well 31, which is illustrated in FIG. 3, to each other. The semiconductor region 16 and the semiconductor region 17 constitute a connection region for feeding a potential to the well 31. The illustrated in FIG. 3, a semiconductor region 22 (ninth semiconductor region) and part of a semiconductor region 23-1 overlap with the semiconductor region 17.

A metal wiring line 19 is connected to the semiconductor region 14 via a connection portion 18. The semiconductor regions 14 and 15, the connection portion 18, and the metal wiring line 19 constitute the signal accumulation electrode 3.

The metal wiring line 19 is connected to a source portion of the transistor 4 illustrated in FIG. 1.

In FIG. 3, an N-type semiconductor substrate 20 with low donor density is provided. In the present exemplary embodiment, the P-type well 31 is formed all across the PD 2 in planar view in FIG. 2. Among the plurality of P-type semiconductor regions of the P-type well 31, a P-type semiconductor region 21 (fifth semiconductor region) is provided at the deepest position. Further, the P-type well 31 includes the P-type semiconductor region 22 at the shallowest position in the well 31. The P-type well 31 includes a three-layer P-type semiconductor region 23 (including semiconductor regions 23-1, 23-2, and 23-3) at a depth between the semiconductor region 21 and the P-type semiconductor region 22. The P-type semiconductor region 23-2 is the second semiconductor region at a depth to which the semiconductor region 17 extends in the depth direction. The P-type semiconductor region 23-3 is the third semiconductor region located at a position deeper than the semiconductor region 17. Each depth is a depth from the first surface F1, which is the incident surface of the semiconductor substrate.

The P-type semiconductor regions 21, 22, 23-1, 23-2, and 23-3 are respectively separated by donor-majority regions 24 and 25, which are regions where donors are a majority. The donor-majority regions (separation layers) 24 and 25 are layers where donors contained in the N-type semiconductor substrate 20 are more included as dopants than acceptors that are ion injected to form the P-type semiconductor regions. The donor-majority region 24 includes donor-majority regions 24-1 and 24-2, and the donor-majority region 25 includes donor-majority regions 25-1 and 25-2. The donor-majority region 24-1 is the fourth semiconductor region, and the donor-majority region 24-2 is the sixth semiconductor region.

In the present exemplary embodiment, the P-type semiconductor regions are formed by injecting acceptors into the low-density, N-type semiconductor substrate 20. On the other hand, the donor-majority regions 24 and 25 are formed without injecting additional donors to the donors contained in the N-type semiconductor substrate 20. In another example, donors can be injected into the donor-majority regions 24 and 25, and in this case, each formed region contains more donors than acceptors. As described below, the donor-majority region 24 contains holes, which are majority carriers of P-type semiconductor regions, as major carriers. The donor-majority region 25 is depleted or can include holes as the major carriers.

FIG. 4 illustrates the dopant profile along line C-D specified in FIG. 3. In FIG. 4, the portion of each component that is illustrated in FIG. 3 is indicated by the same reference numeral as that in FIG. 3. The dopant density of each semiconductor region is not constant, therefore, the average dopant density will be described. Further, dopants of each layer can contain both acceptors and donors. In a case where more acceptors are contained than donors, the conductivity type is P-type, whereas in a case where more donors are contained than acceptors, the conductivity type is N-type, and the difference between them is the dopant density of the layer.

The dopant density of the P-type semiconductor region 21 is the highest density among the P-type wells and is, for example, 5E15 cm$^{-3}$, where "E" refers to the power of base 10. In other words, "E15" refers to $10^{15}$. The P-type semiconductor regions 22 and 23 have substantially the same dopant density, e.g., 6E14 cm$^{-3}$. The dopant density of each of the donor-majority regions 24 and 25, where the dopants corresponding to the N-type are a major region, is, for example, 2E14 cm$^{-3}$.

The P-type semiconductor regions 22, 23-1, 23-2, 23-3, 24-1, 24-2, 25-1, and 25-2 have substantially the same width, and in the present exemplary embodiment, the width is, as an example, about 0.6 microns. As illustrated in FIG. 4, the thickness of the entire configuration of the alternating acceptor/donor layers from the P-type semiconductor region 22 to the donor-majority region 24-2 is about 4.8 microns where the P-type semiconductor regions (acceptor-majority regions) and the donor-majority regions are alternately formed in the depth direction.

In general, when the P-type semiconductor and the N-type semiconductor are in contact with each other, a built-in potential is generated in the junction portion. The value of the built-in potential is typically about 700 meV. On the contrary, the alternating acceptor/donor layers in the present exemplary embodiment do not have such a characteristic of generating a built-in potential of several hundred meV as generated in a normal p-n junction. Potential unevenness in the alternating acceptor/donor layers are about the same as the thermal energy kT, i.e., about 26 meV at room temperature, where k is the Boltzmann constant and T is the absolute temperature. Thus, the characteristic is similar to the characteristic of the semiconductor having an entirely uniform low dopant density.

To describe this point, first, the case will be discussed below where charge density ρ is expressed by a cosine curve having the cycle 2d with respect to position x as in FIG. 5A. The charge density ρ is $$\rho = q \; Nm \cdot \cos(\pi/d \cdot x) \qquad \text{(formula 1)},$$

where qNm and −qNm are respectively maximum and minimum values of the charge density and q is the elementary charge.

The mean charge density in the region of width d with positive charge density is 2 qNm/π, and the mean charge density in the region of width d with negative charge density is −2 qNm/π.

From the Gauss's law in electricity, the electric field intensity E is $$E = d \cdot q \; Nm/(\pi \varepsilon) \cdot \sin(\pi/d \cdot x) \qquad \text{(formula 2)},$$

where the x-direction is positive and ε is the permittivity of the semiconductor.

Accordingly, the potential V at the position x is $$V = d^2 \cdot q \; Nm/(\pi^2 \varepsilon) \cdot [\cos(\pi/d \cdot x) - 1] + V1 \qquad \text{(formula 3)}$$

where V1 is a constant number depending on how the reference potential is set, and if the formula is simplified and changed to $V0 = d^2 \cdot qNm/(\pi^2 \varepsilon)$, when $V0 = V1$, $$V = V0 \cdot \cos(\pi/d \cdot x) \qquad \text{(formula 4)}$$

is obtained. The potential V expressed by formula 4 is illustrated in FIG. 5B.

From the above-described formulas, the potential unevenness of the alternating acceptor/donor layers in the present exemplary embodiment are calculated as follows:

First, the P-type dopant, i.e., the acceptor, is the negative ion, so that the density of the P-type dopant is negative. On the other hand, the N-type dopant, i.e., the donor, is the positive ion, so that the density of the N-type dopant is positive. The mean dopant density of the alternating acceptor/donor layers is calculated as $$(-6E14 \; cm^{-3} \times 4 + 2E14 \; cm^{-3} \times 4)/8 = -2E14 \; cm^{-3}.$$

Further, the charge are zero in the aggregate, so that the mean density of the holes is 2E14 cm$^{-3}$.

Assuming that at this time, the potential unevenness are small to the extent that they correspond to the thermal energy, holes are present across the alternating acceptor/donor layers, and there are no electrons. Additionally, assuming that holes are distributed such that the mean hole density of the P-type semiconductor regions 22 and 24 is 3E14 cm$^{-3}$ and the mean hole density of the N-type dopant-majority regions 24 and 25 is 1E14 cm$^{-3}$. If this hypotheses are correct, a result that does not contradict the hypotheses should be obtained.

Figure 5A:
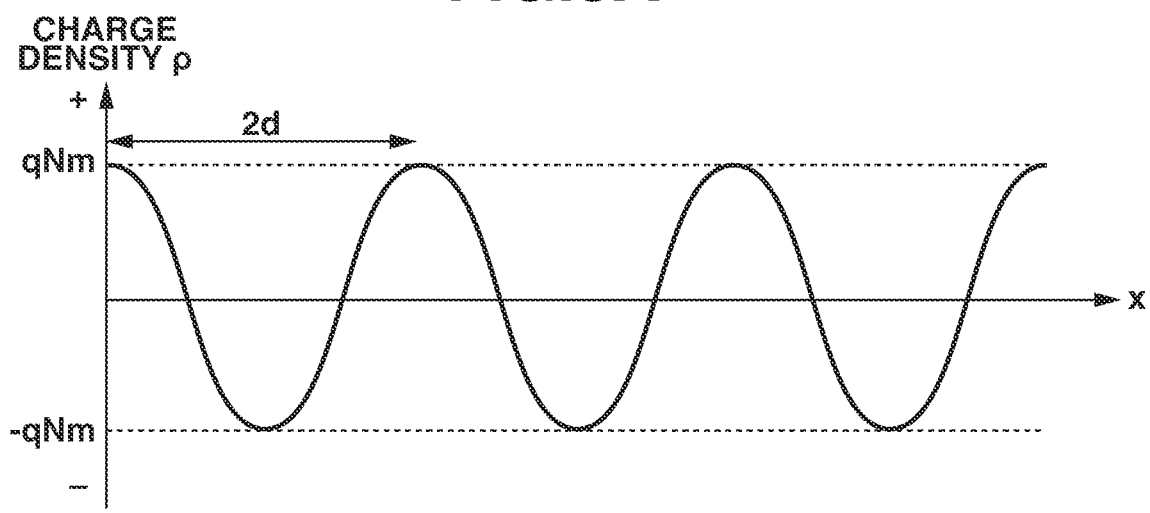
FIGS. 5B and 5B illustrate a charge density and potential of a well of a photoelectric converter.
Figure 5B:
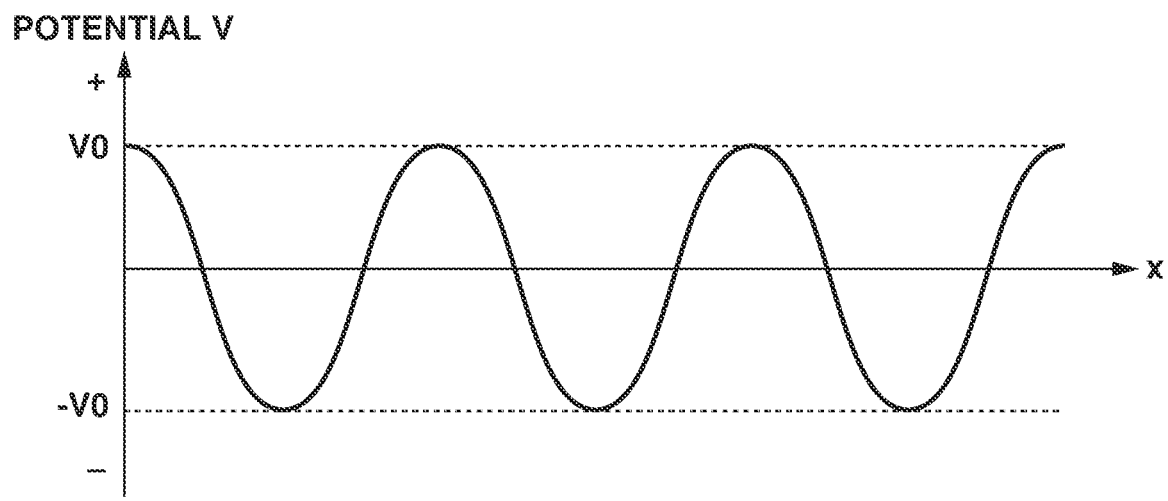

Then, if the charge distribution by the holes and dopants is approximated using a cosine curve, the charge distribution as illustrated in FIG. 5A is obtained. In FIG. 5A, a region showing a positive charge density is an N-type dopant-majority region, whereas a region showing a negative charge density is a P-type semiconductor region. Since d=0.6 microns and the mean density=2/π·Nm=3E14 cm$^{-3}$, Nm=4.7E14 cm$^{-3}$.

If the semiconductor is silicon and its relative permittivity is 11.9, V0=26 mV. This value corresponds to 26 meV, which is the thermal energy of the carriers at room temperature, and agrees with the assumption that the potential unevenness is small to the extent that they correspond to the thermal energy. Further, the difference between the mean potentials of the P-type and N-type dopant-majority regions is 26 meV. Thus, the ratio of the mean hole densities is exp (26 meV/kT). At room temperature, 26 mV is nearly equal to kT and thus approximately the value of the base e of natural logarithms, which is about 2.72. This value is close to the ratio between 3E14 cm$^{-3}$ and 1E14 cm$^{-3}$ of the hypothesis, which is 3, and this also agrees with the assumption. Thus, features of the alternating acceptor/donor layers according to the present exemplary embodiment have are that the internal potential unevenness is approximately 26 meV, which is the thermal energy at room temperature, and the acceptor density is 2E14 cm$^{-3}$, which are near those of a P-type well having a uniform, significantly low density.

From the above-described descriptions, the internal potential unevenness of the alternating acceptor/donor layers is approximately equal to the thermal energy or less as in the present exemplary embodiment when qV0≈<kT, that is, $d^2 \cdot q^2 \, Nm/(\pi^2 \varepsilon) \approx <kT$.

This is rewritten as $$d \approx <(2\pi)^{1/2}(\varepsilon/(q \cdot 2\, Nm/\pi) \cdot kT/q)^{1/2} \quad \text{(formula 5)}.$$

The right side of formula 5 is π×(Debye length of the mean charge density 2 Nm/π). The Debye length represents the resolution limit of potential change. As specified by formula 5, in a thermal equilibrium state, the potential unevenness is maintained at about kT by forming a donor semiconductor region having a thickness (width of the substrate in the depth direction) that is nearly equal to the Debye length.

Each donor-majority region of the alternating acceptor/donor layers is sandwiched between upper and lower P-type semiconductor regions (acceptor-majority regions). Thus, the physical interpretation is possible that if d/2 is nearly equal to the Debye length, the potential difference between the N-type dopant-majority region and the P-type semiconductor region is about kT, and the formula 5 indeed supports the interpretation.

In the formula 5, Nm is a charge density of a combination of fixed charge caused by dopants and charge caused by carriers. Since a charge distribution of carriers is determined based on potentials, it is not easy to calculate an accurate charge distribution. Furthermore, the alternating acceptor/donor layers do not always have an orderly dopant density.

Accordingly, the actual semiconductor device is taken into consideration much more in determining a relationship between a dopant density and the thickness of each semiconductor region.

First, the P-type semiconductor region and the donor-majority region are assumed to have substantially the same thickness d. Further, the P-type semiconductor region has a mean dopant density N1 which is higher than a donor-majority region and the donor majority region has a mean dopant density N2.

At this time, the mean hole density is (N1−N2)/2 as discussed above in deriving the formula 5. When the hole density of the P-type semiconductor region is three times the hole density of the N-type dopant-majority region, the P-type semiconductor region has negative charge of the mean density (N1+3N2)/4 owing to the dopants of the density N1 and the holes of the density ¾(N1−N2). The N-type dopant-majority region has positive charge of the mean density (N1+3N2)/4. Thus, the charge density Nav= (N1+3N2)/4 is defined, and a Debye length LD=(ε/(qNav) ·kT/q)$^{1/2}$ is determined with respect to the charge density.

The following conditional expression $$LD \approx <d \approx <4LD \quad \text{(formula 6)}$$

defines d.

can be said that if the thickness d is set to a value in the range from 0.8 times or more to 4 or less times the Debye length LD, the alternating acceptor/donor layers have a characteristic similar to that of the P-type well.

LD≈<d because setting the thickness d to a value less than the Debye length LD does not change the flatness of the internal potential but only increases difficulties in forming fine alternating acceptor/donor layers. Further, while the left side of formula 5 is (2π)$^{1/2}$LD, which is about 2.5 LD, d≈<4LD in formula 6 because a trigonometric function distribution of the charge density based on which formula 5 is derived is a mere approximation and its results vary depending on the distribution form of the charge density. Furthermore, the point that the present disclosure is realized even if the potential unevenness exceeds kT to some extent, is also considered. Depending on charge density distributions, it is also suitable to set the thickness d to a value in the range from two times to three times the Debye length LD.

Figure 6:
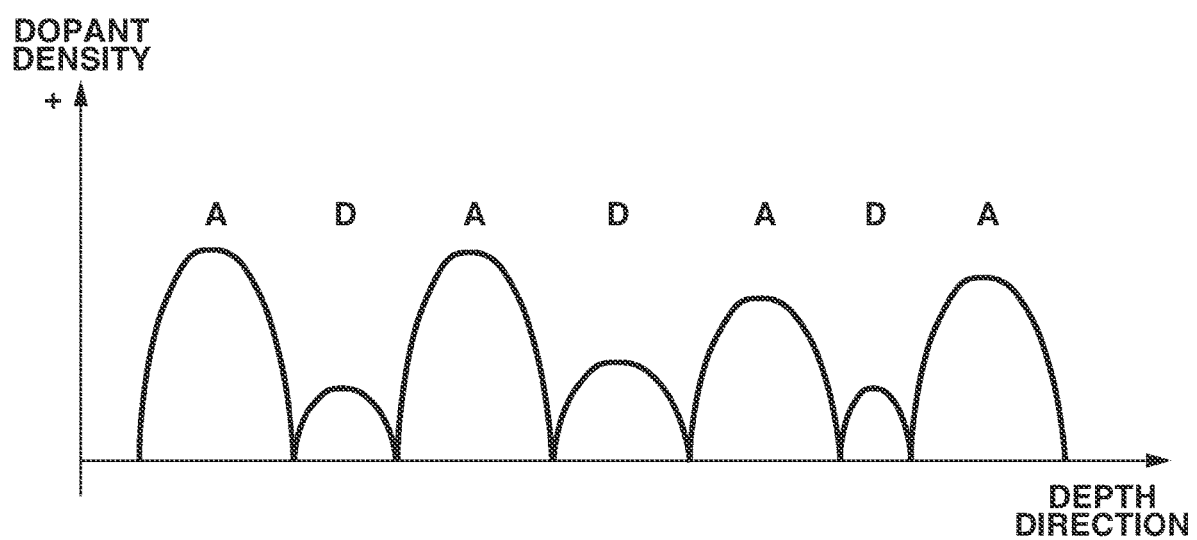
FIG. 6 illustrates an example of a dopant density of a well of a photoelectric converter.

FIG. 6 illustrates an example of alternating acceptor/donor layers. In FIG. 6, "A" indicates the acceptor-majority region, and "D" indicates the donor-majority region. The thickness is d, and the mean dopant density has different values at different positions. In this case, for example, the value of the Debye length LD, which defines the width d of the N-type dopant-majority region at a center, is determined from the mean dopant N2 of the donor-majority region at the center and the dopant density N1, which is the mean value of the two upper and lower P-type semiconductor regions sandwiching the layer. For the value of N1, which determines the value of the Debye length LD that defines the thickness d of the donor-majority region contacting the P-type semiconductor region 21, the mean dopant density of the P-type semiconductor region 23 contacting the donor-majority region on the shallower side, is used. For the value of N2, which determines the Debye length LD that defines the thickness d of the P-type semiconductor region 22 at the shallowest position, the mean dopant density of the donor-majority region contacting the semiconductor region 22 on the deeper side is used.

Whether the thickness d of each of the alternating acceptor/donor layers satisfies the formula 6 is determined as described above. All the P-type semiconductor regions 22 and 23 and the donor-majority regions 24 and 25 do not necessarily satisfy the formula 6, and there can be a case where only some of them satisfy the formula 6.

As described above, according to the present exemplary embodiment, the alternating acceptor/donor layers that have the thickness d satisfying the formula 6 have the characteristic similar to that of the P-type well having a low dopant density.

Figure 7:
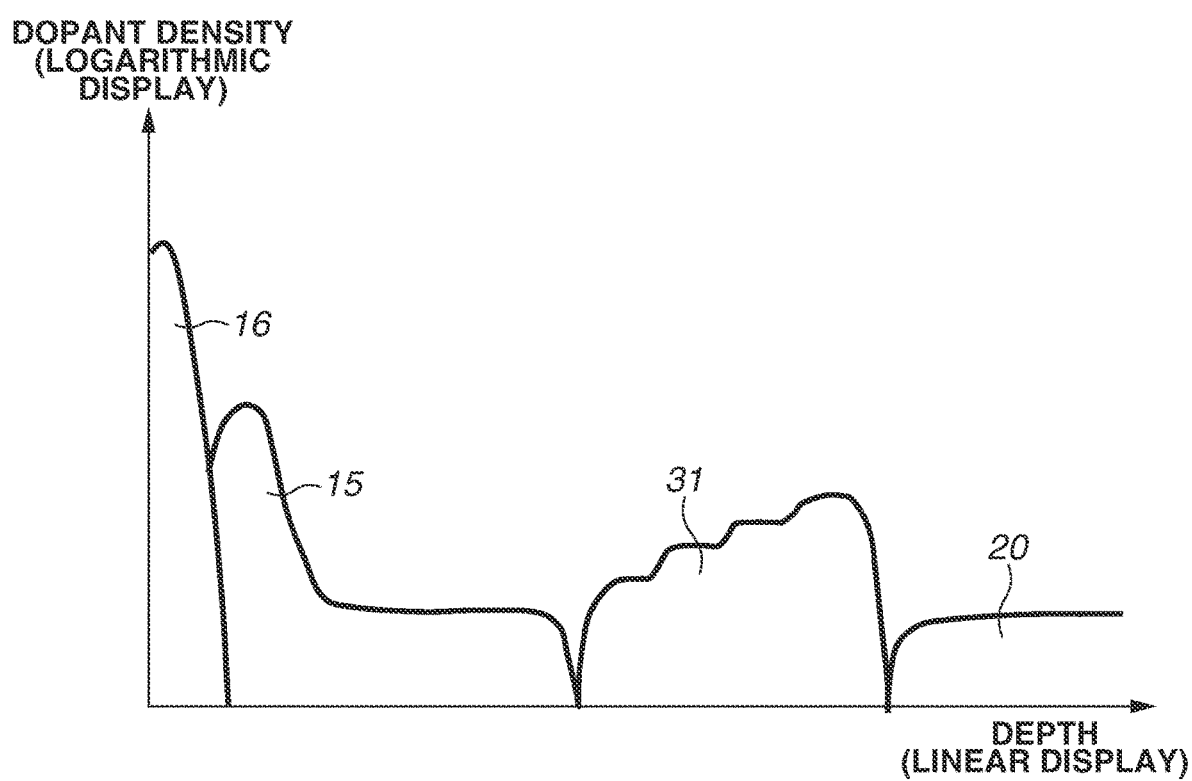
FIG. 7 illustrates an example of a dopant density of a photoelectric converter.

A comparative example will be described below. FIG. 7 illustrates a dopant density profile in the depth direction of the PD. In this case, the P-type well is formed at a position (about 4 microns from the surface) that is so deep that the P-type semiconductor region 17 illustrated in FIG. 3 does not reach the position in Japanese Patent Application Laid-Open No. 2008-263227. The deepest layer of the P-type well 31 in FIG. 3 is so deep that the amount of dopant is limited to a low level in the manufacturing process. Thus, in order to provide a potential gradient to the P-type well 31 toward the N-type semiconductor region, there could be one method that the dopant density of each layer of the P-type semiconductor regions is decreased by, for example, ⅓ toward shallower positions. In general, there is a low limit with respect to the amount of ions that can be implanted into a semiconductor region due to the control time in the ion implant process. Thus, it is difficult to implant fewer ions than the low limit. Therefore, if the dopant densities of the P-type semiconductor regions are gradually decreased, it becomes difficult to provide a sufficient number of layers of P-type semiconductor regions in order to give a suitable potential gradient to the P-type well 31 toward the N-type semiconductor region 15.

Consequently, the P-type semiconductor region of the P-type well 31 at the shallowest position in the P-type well 31 is placed deeper than the position contacting the N-type semiconductor region 15.

Consequently, the depth from which accumulation of signal charge in the N-type semiconductor region 15 is started is placed deeper than a dopant peak depth of the N-type semiconductor region 15. Thus, the value of a p-n junction capacitance between the N-type semiconductor region 15 and the P-type well 31 becomes small. Furthermore, a p-n junction capacitance between the N-type semiconductor region 15 and the P-type semiconductor region 16 of the front surface also decreases. As a result, the amount of saturation signals of the photoelectric converter decreases.

Furthermore, in the case of the form illustrated in FIG. 7, the value of a voltage Vres for resetting the photoelectric converter is to be decreased. Thus, the amount of saturation signals of the photoelectric converter further decreases. This will be described below.

In general, the N-type semiconductor region 15 is depleted at the time of resetting. A reverse-biased voltage that is applied to the p-n junction at this time is the voltage Vres.

For example, in a case of completely transferring signal charge accumulated in the photoelectric converter from the photoelectric converter, the voltage Vres is the maximum voltage with which the signal charge are completely transferred. The voltage Vres is determined based on a structure of the photoelectric converter, a power source voltage, and so on. In the photoelectric converter illustrated in FIG. 7, signal charge are accumulated at a position deeper than the dopant peak position of the N-type semiconductor region 15 as described above. Thus, the signal charge are accumulated at a deep position far from the front surface of the semiconductor where a signal transfer path is formed. In this situation, it is difficult to completely transfer the accumulated signal charge from the photoelectric converter. Thus, if the condition of the power source voltage is the same, the value of the voltage Vres must be decreased in order to completely transfer the signal charge, and the dopant density of the N-type semiconductor region 15 must be decreased so that depletion is realized with the decreased voltage Vres. Consequently, the amount of saturation signals of the photoelectric converter significantly decreases.

As another example, some carriers remain in the photoelectric converter when the photoelectric converter is read as illustrated in FIG. 1, not as in the complete transfer type described above. As an example thereof, a configuration is illustrated in FIG. 1 in which the photoelectric converter is connected to a reading circuit including a charge integrator. In this case, the voltage Vres is determined based on a reference potential of the charge integrator.

Also in this case, the N-type semiconductor region 15 is to be depleted because if signal charge remain in the N-type semiconductor region 15, a PD capacitance at the time of PD resetting (i.e., immediately after the reading) increases. Consequently, reset noise that is thermal noise increases. Thus, in a case where an N-type semiconductor region having a low dopant density is provided below the N-type semiconductor region 15 as illustrated in FIG. 7, signal charge are likely to accumulate in the low dopant density region. Accordingly in order to deplete the low dopant density region, the voltage Vres is increased. However, in order to decrease the reset noise, i.e., in order to realize depletion up to the region of the low dopant density at the time of resetting, the depletion voltage of the N-type semiconductor region 15 is to be decreased. In order to realize depletion with the decreased voltage, the dopant density of the N-type semiconductor region 15 is decreased. Consequently, the amount of saturation signals significantly decreases in the photoelectric converter.

The setting of a potential of the P-type well in a case of forming the P-type well at a deep position, and a problem that arises in a case where the P-type semiconductor regions of the well are apart from each other and an N-type semiconductor regions are formed between them as described in the Japanese Patent Application Laid-Open No. 2008-263227 will be described below.

In general, the potential of the P-type semiconductor region 16 on the front surface is provided directly by a power source terminal located on a front surface portion of the semiconductor. The potential of the P-type well is set equal to that of the P-type semiconductor region 16 by a P-type connection layer that electrically connects the P-type semiconductor region 16 on the front surface and the P-type well. The semiconductor region 17 in FIG. 3 is, for example, the P-type connection layer. The P-type connection layer generally has the role of electrically separating the adjacent photoelectric converters. Thus, the P-type connection layer is located in a region separating the photoelectric converters, so that the width of the P-type connection layer is smaller than the width of the P-type well in planar view. Thus, by any manufacturing technique, it is difficult to form the P-type connection layer up to the depth of the layer of the P-type well at the deepest position in the P-type well, so that the P-type connection layer electrically connects only to the shallow portion of the P-type well. In this state, if an N-type semiconductor region to be depleted is located between the plurality of P-type semiconductor regions of the P-type well and deeper than the P-type connection layer as discussed in the Japanese Patent Application Laid-Open No. 2008-263227, a P-type semiconductor region of the P-type well that is located at a position deeper than the depleted N-type semiconductor region is electrically disconnected from the layers of the P-type well at shallower positions and thus becomes an electrically floating state. In this state, the deep portion of the P-type well cannot perform stable operations as a signal charge layer. Therefore, a deep P-type well in which an N-type semiconductor region to be depleted is located at a middle portion of the P-type well, has a problem in practical use.

As described above, in a case of forming a P-type well with a depth of about 4 microns or greater, the configuration discussed in the Laid-Open No. 2008-263227 has difficulties in realizing low noise, an amount of saturation charge, and depletion that are characteristics of a photoelectric converter.

In the present exemplary embodiment, the donor-majority regions 24 and 25 contain holes as major carriers in the P-type well 31. While the donor-majority region 25 may contain holes as major carriers, in one embodiment, the donor-majority region 25 is depleted as described below. In this way, the P-type semiconductor region 22 can be located near the N-type semiconductor region 15 even in a case where the number of layers is the same as the number of P-type semiconductor regions of the P-type well in FIG. 7. Further, the P-type well 31 according to the present exemplary embodiment has a characteristic similar to that of a P-type well having a uniform, significantly low dopant density. Thus, the depletion layer extends to a deep portion of the P-type well 31, and the region up to the donor-majority region 25 in FIG. 4 is depleted. The dopant density ratio between the alternating acceptor/donor layers and the P-type semiconductor region 21 at the deepest position virtually shows a sufficient value. Consequently, a proper potential barrier for the signal charge is formed in the P-type semiconductor region 21 at the deepest position. Thus, signal electrons generated by incident light at a position shallower than the dopant peak depth of the P-type semiconductor region 21 at the deepest position are promptly collected by the N-type semiconductor region 15. In other words, high quantum efficiency (high sensitivity) is realized. Further, since the P-type semiconductor region 22 is closer to the N-type semiconductor region 15, signal charge accumulated in the N-type semiconductor region 15 are collected at a shallower region than that in FIG. 7. Thus, the p-n junction capacitance between the P-type semiconductor region 16 on the front surface and the N-type semiconductor region 15 can be increased, and a large amount of saturation signals of the N-type semiconductor region 15 is realized. Furthermore, the donor-majority region 24, and the P-type semiconductor region 23 contacting the donor-majority region 24 could be designed not to be depleted and to have holes as major carriers. Thus, holes are present as majority carriers also even in the donor-majority region 24, and the electrical connection extends to the P-type semiconductor region 21 at the deepest position through the P-type separating region 17, and the potential setting of the P-type well is set. Thus, stable operations as a photoelectric converter are realized.

A second exemplary embodiment of the present disclosure will be described below, mainly the difference from the first exemplary embodiment is described.

Figure 8:
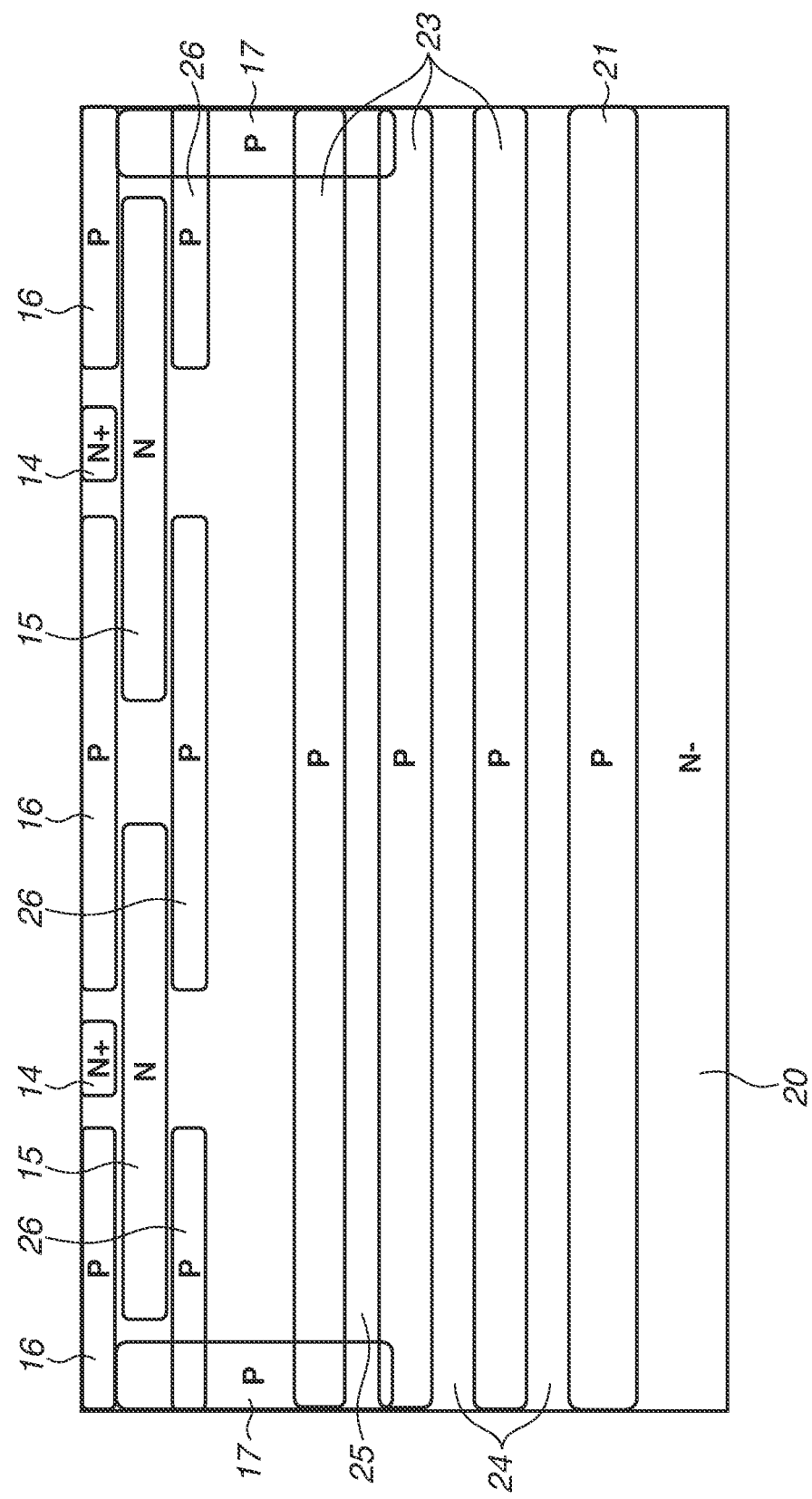
FIG. 8 illustrates an example of a configuration of a photoelectric converter.

The reading circuit and the planar layout view according to the second exemplary embodiment are similar to those in FIGS. 1 and 2 according to the first exemplary embodiment. FIG. 8 is a cross-sectional view along line A-B in FIG. 2. In FIG. 8, a P-type semiconductor region 26 (another example of the ninth semiconductor region) is below the N-type semiconductor region 15 and forms a p-n junction with the N-type semiconductor region 15. A planar layout of the P-type semiconductor region 26 is similar to that of the P-type semiconductor region 16, except for a terminal configured to feed a potential to the P-type semiconductor region 16. Specifically, the P-type semiconductor region 26 is not in a region that overlaps with the N-type semiconductor region 14 in planar view. Further, the P-type semiconductor region 22 illustrated in FIG. 3 is not included. In FIG. 8, each component similar to that in FIG. 3 is specified by the same reference numeral, and description thereof is omitted.

In the configuration in FIG. 8, first, the P-type semiconductor region 26 more strongly prevents signal charge to be accumulated in the N-type semiconductor region 15 from being accumulated in a deep portion than the first exemplary embodiment.

Secondly, the P-type semiconductor region 26 includes a portion that is not to be depleted and is to be a neutral region. The portion is the region where the N-type semiconductor region 15 does not locate in planar view and its vicinity. The neutral region and the N-type semiconductor region 15 form a large p-n junction capacitance. With the two effects, a greater amount of saturation signals than that in the first exemplary embodiment is realized.

Furthermore, the P-type semiconductor region 26 is not in a portion that overlaps with the N-type semiconductor region 14 in planar view. Further, the P-type diffusion layer 22, which is included in the first exemplary embodiment, is not included. Thus, in this portion, the depletion layer extends deeper than the first exemplary embodiment, i.e., the depletion layer extends to a region deeper than the P-type semiconductor region 17. With this configuration, signal charge generated at a region deeper than that in the first exemplary embodiment can be collected, so that higher quantum efficiency (high sensitivity) is realized.

The deep depletion layer is located partially at a position that overlaps with the N-type semiconductor region 14 in planar view. A region of the donor-majority region 24 that at least overlaps with at least the P-type semiconductor region 17 in planar view is not depleted, and holes are present as major carriers as in the first exemplary embodiment. Thus, the potential given to the P-type semiconductor region 16 from the front surface portion of the semiconductor substrate is also given to the P-type semiconductor region 21 at the deepest position through the electric connection. Thus, stable operations are realized as in the first exemplary embodiment. Further, it is thought to be better that the depletion depth at the portion where the N-type semiconductor region 15 overlaps the p-type semiconductor region 26 in the planar view is about the same as or more than that of the first embodiment.

As described above, according to the second exemplary embodiment, a higher saturation charge level and higher sensitivity than those in the first exemplary embodiment and stable operations of a photoelectric converter as in the first exemplary embodiment are realized.

A third exemplary embodiment will be described below, mainly a difference from the second exemplary embodiment will be described.

Figure 9:
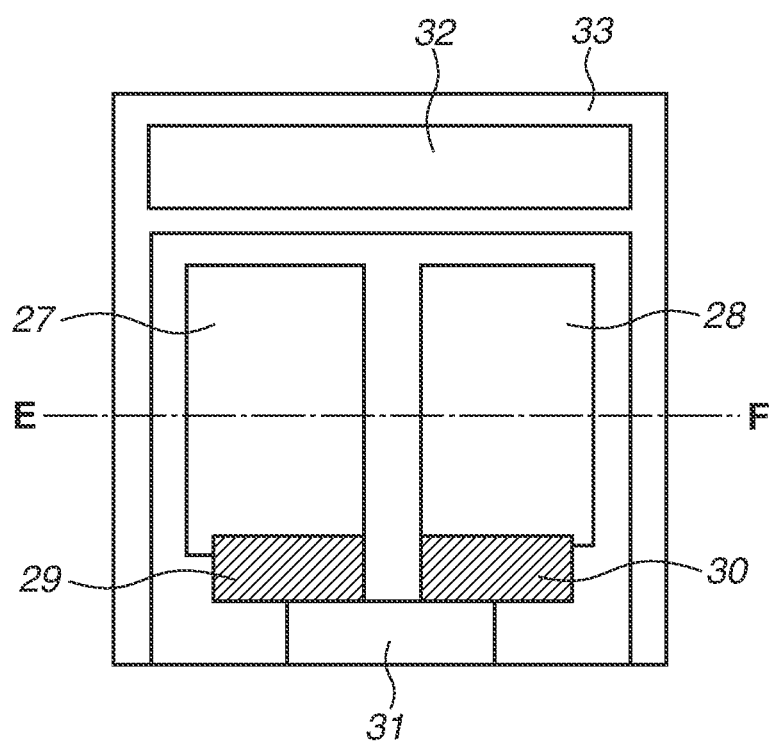
FIG. 9 illustrates an example of a pixel configuration.

FIG. 9 is a plan view illustrating a unit pixel of an image capturing apparatus according to the present exemplary embodiment.

The unit pixel includes an N-type semiconductor region 27 and a second N-type semiconductor region 28. The unit pixel further includes a first transfer gate 29, a second transfer gate 30, and an N-type floating diffusion layer (hereinafter, "FD") 31. The first transfer gate 29 controls the transfer of signal charge accumulated in the N-type semiconductor region 27 to the FD 31. The second transfer gate 30 controls the transfer of signal charge accumulated in the N-type semiconductor region 28 to the FD 31.

The unit pixel further may include a transistor region 32 including a pixel transistor. The transistor region 32 includes a reset transistor and an amplification transistor. The reset transistor resets the FD 31, and the amplification transistor outputs a signal based on the potential of the FD 31. The transistor region 32 can include a transistor for changing the capacitance value of the FD 31 and/or a selection transistor for selecting whether to output or not output a signal from the unit pixel. While one unit pixel is illustrated in FIG. 9, a plurality of unit pixels in several thousand columns and several thousand rows is arranged in the image capturing apparatus. An element separation region 33 is provided to separate the plurality of unit pixels from each other.

Figure 10:
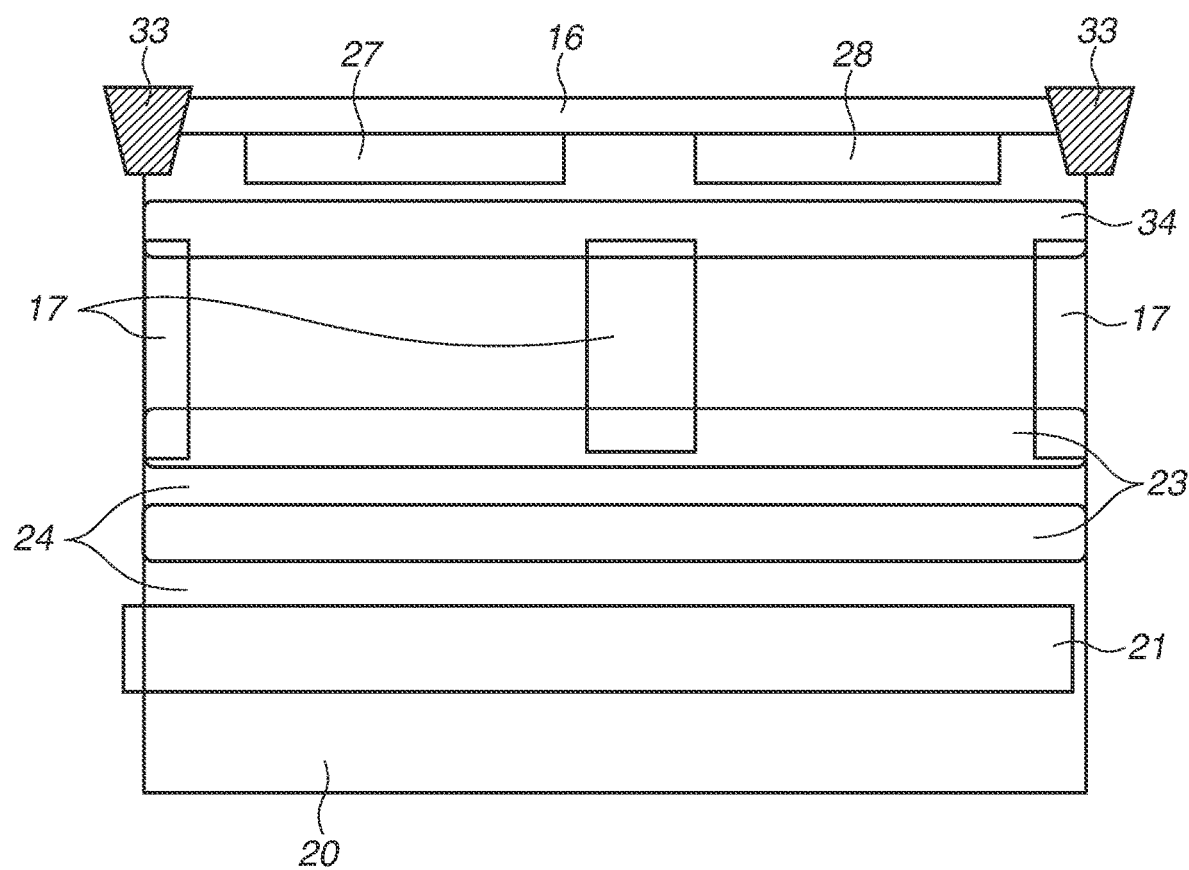
FIG. 10 illustrates an example of a configuration of a photoelectric converter.

Further, the unit pixel may include the plurality of the N-type semiconductor regions 27 and 28 so that a phase difference signal for realizing a focal point detection function ca be obtained. FIG. 10 is a cross-sectional view along line E-F specified in FIG. 9. In FIG. 10, a P-type semiconductor region 34 is disposed below the N-type semiconductor regions 27 and 28. The P-type semiconductor region 34 includes a similar function to that of the P-type semiconductor region 26 according to the second exemplary embodiment. A difference from the P-type semiconductor region 26 according to the second exemplary embodiment is that the P-type semiconductor region 34 extends across the pixel portion in planar view according to the present exemplary embodiment. Thus, it can also be said that the P-type semiconductor region 34 is the P-type semiconductor region 22 in FIG. 3 that is arranged nearer to the N-type semiconductor regions 27 and 28.

In FIG. 10, each component similar to that in FIG. 8 or 9 is specified by the same reference numeral, and description thereof is omitted. The P-type semiconductor region 23 and the donor-majority region 24 form alternating acceptor/donor layers as described in the first and second exemplary embodiments.

At each central portion of the N-type semiconductor regions 27 and 28, potential is the lowest. Therefore, the highest reverse bias is applied to the central portions of the N-type semiconductor regions 27 and 28, and the P-type semiconductor region 34. Thus, if the dopant density of the P-type semiconductor region 34 is set as appropriate, the P-type semiconductor region 34 is depleted in a penetrating manner in the depth direction at the positions of the central portions of the N-type semiconductor regions 27 and 28 in planar view. In such a configuration, the N-type semiconductor regions 27 and 28, and the P-type semiconductor region 34 have a large p-n junction capacitance, so that a large amount of saturation signals is acquired. Furthermore, signal charge generated up to the depth of the P-type semiconductor region 21 at the deepest position are promptly collected through the depleted portion of the P-type semiconductor region 34, in the N-type semiconductor regions 27 and 28, so that high sensitivity is realized. Further, the donor-majority region 24 is not depleted and includes holes as major carriers. Thus, the plurality of P-type semiconductor regions at different depths in the pixel portion is electrically connected to each other. A potential given to the P-type semiconductor region 16 on the front surface is provided across the entire neutral region of the P-type semiconductor regions of the pixel portion. Thus, stable operations of a photoelectric converter are realized.

Part of the P-type semiconductor region 34 according to the third exemplary embodiment may not be provided (an N-type semiconductor region is present instead) in planar view as in the P-type semiconductor region 26 according to the second exemplary embodiment. In one embodiment, a region where the P-type semiconductor region 34 is not provided is near the central portions of the N-type semiconductor regions 27 and 28.

As described above, according to the third exemplary embodiment, high saturation, high sensitivity, and stable operations of a photoelectric converter are realized.

A fourth exemplary embodiment will be described below. A photoelectric conversion apparatus according to the present exemplary embodiment includes pixels, in which a capacitance value to be added to a photoelectric converter is changed based on the amount of signal charge accumulated in the photoelectric converter. Components will be described with reference to the same reference numerals as those in the first exemplary embodiment.

Figure 11:
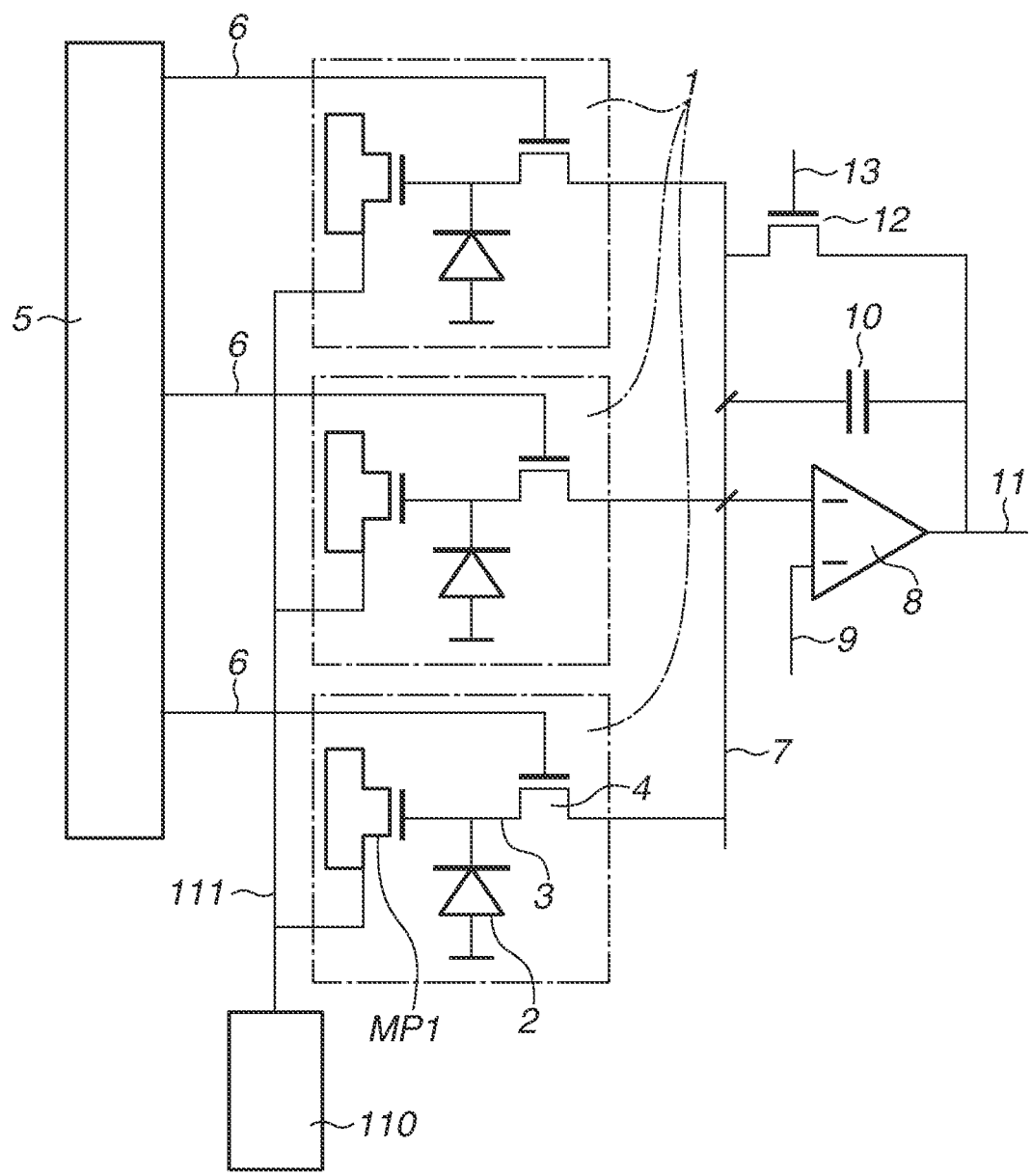
FIG. 11 illustrates an example of a configuration of a photoelectric conversion apparatus.

FIG. 11 illustrates a configuration of a pixel 1 according to the present exemplary embodiment. Each pixel 1 includes a P-type MOS transistor MP1. The transistor 4 is an N-type MOS transistor.

A cathode of the PD 2 is connected to a gate of the P-type MOS transistor MP1 and a source of the N-type MOS transistor 4. A source and drain of the P-type MOS transistor MP1 are connected to a voltage supply line 111 of the corresponding column. Alternatively, one of the source and drain of the P-type MOS transistor MP1 can be connected to the voltage supply line 111 of the corresponding column and the other can be set to a floating state.

Figure 12:
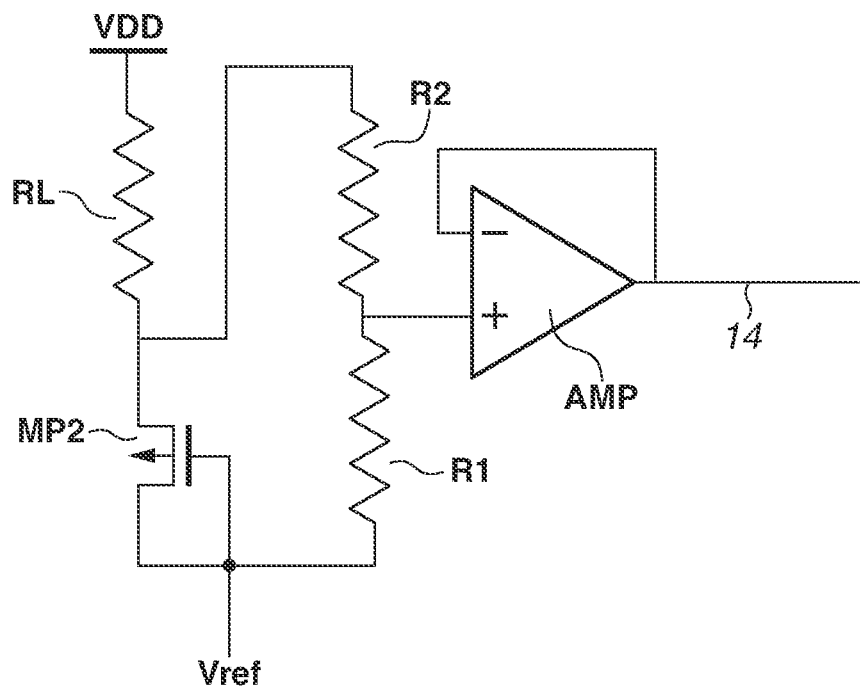
FIG. 12 illustrates an example of a configuration of a voltage supply circuit.

The voltage supply line 111 of each column is connected to a voltage supply circuit 110. As illustrated in FIG. 12, the voltage supply circuit 110 includes a calculation amplifier AMP, a load resistor RL, resistors R1 and R2, and a P-type MOS transistor MP2. The resistors R1 and R2 are resistor elements having a higher resistance than the load resistor RL.

One terminal of the load resistor RL is connected to a power source voltage node (voltage VDD). Another terminal of the load resistor RL is connected to one terminal of the resistor R2 and a source of the P-type MOS transistor MP2. A drain and gate of the P-type MOS transistor MP2 and one terminal of the resistor R1 are connected to a reference voltage node (voltage Vref). The voltage Vref is the same as the voltage Vref that is fed to a non-inverting input terminal (+) of a calculation amplifier 42. Another terminal of the resistor R1 and another terminal of the resistor R2 are connected to a non-inverting input terminal (+) of the calculation amplifier AMP. In other words, the resistors R1 and R2 are connected in series between the gate and drain, and the source of the P-type MOS transistor MP2. A connection node between the resistors R1 and R2 is connected to the non-inverting input terminal (+) of the calculation amplifier AMP. An inverting input terminal (−) and an output terminal of the calculation amplifier AMP are short-circuited and form a voltage follower circuit. The output terminal of the calculation amplifier AMP is connected to the voltage supply line 111.

Parameters of the respective elements of the voltage supply circuit 110 are set as appropriate so that a state of the P-type MOS transistor MP1 is changed from an off-state to an on-state in a potential varying range of signal charge accumulated in the N-type semiconductor region 14 from zero to the saturation level.

The voltages of the source and drain of the P-type MOS transistor MP1 are set so that the P-type MOS transistor MP1 enters the off-state when the voltage of the N-type semiconductor region 14 is in a reset state immediately after signal charge are read from the photoelectric converter PD.

Since the P-type MOS transistor MP1 is formed on the low-density N-type semiconductor substrate 20 or an n-well, a wide depletion layer is formed on a semiconductor layer below a gate electrode of the P-type MOS transistor MP1 during the off-state, and a gate capacitance becomes significantly small. Thus, kTC noise generated at the time of resetting the photoelectric converter PD due to a parasitic capacitance connected to the N-type semiconductor region 14 is reduced to a sufficiently low level.

The potential of the N-type semiconductor region 14 decreases as the amount of signal charge accumulated in the N-type semiconductor region 14 increases. When the potential of the N-type semiconductor region 14 becomes lower than a predetermined potential, the state of the P-type MOS transistor MP1 is changed to the on-state. When the state of the P-type MOS transistor MP1 is changed to the on-state, the front surface portion of the N-type semiconductor substrate 20 immediately below the gate electrode of the P-type MOS transistor MP1 is inverted to P-type and holes are accumulated, and the state of the gate electrode is changed to a state where a large capacitance, which is a gate insulation layer capacitance, enters a connected state. Thus, although the p-n junction capacitance of the photoelectric converter PD is small, a high saturation charge level is realized with the large gate capacitance connected to the N-type semiconductor region 14.

The amount of signal charge accumulated in the cathode (the N-type semiconductor region 14) of the photoelectric converter PD is a first accumulation amount, and the gate capacitance of the P-type MOS transistor MP1 when the P-type MOS transistor MP1 is in the off-state is a first capacitance.

In a case where the amount of signal charge accumulated in the N-type semiconductor region 14 is a second accumulation amount greater than the first accumulation amount, the state of the P-type MOS transistor MP1 is changed to the on-state. The gate capacitance of the P-type MOS transistor MP1 in the case where the P-type MOS transistor MP1 is in the on-state is a second capacitance greater than the first capacitance. At this time, the front surface portion of the N-type semiconductor substrate below the gate electrode of the P-type MOS transistor MP1 is in an inverted state.

To realize the above-described operations, the voltages to be applied to the source and drain of the P-type MOS transistor MP1 are set by the voltage supply circuit 110 as follows in the present exemplary embodiment.

The P-type MOS transistor MP2 of the voltage supply circuit 110 have a similar configuration to that of the P-type MOS transistor MP1 of the pixel 1. Specifically, a threshold voltage of the P-type MOS transistor MP2 is equal to a threshold voltage of the P-type MOS transistor MP1. The phrase "the MOS transistors have a similar configuration" indicates that parameters that define characteristics of the MOS transistors are similar, such as a gate insulation layer thickness, gate length, and dopant densities of the respective components. MOS transistors including element parameters formed simultaneously on the same substrate are similarly affected by variations in manufacturing, so that characteristic values such as threshold voltages can be equalized.

The voltage Vref is fed to the gate and drain of the P-type MOS transistor MP2, and the voltage VDD is fed to the source of the P-type MOS transistor MP2 via the load resistor RL. Consequently, the P-type MOS transistor MP2 is in the on-state, and a source current flows via the load resistor RL. Resistance values of the resistors R1 and R2 are set higher than a resistance value of the load resistor RL so that part of the current that flows through the load resistor RL becomes the source current of the P-type MOS transistor MP2 and the rest becomes a current that flows through the resistors R2 and R1.

A source voltage of the P-type MOS transistor MP2 is $Vref-Vth+\Delta V$, where Vth is the threshold voltage of the P-type MOS transistor MP2 (threshold voltage Vth is a negative voltage). The value of $\Delta V$ is a positive voltage value that is determined based on an electric current characteristic of the P-type MOS transistor MP2 and a source current value. For simplification, it is assumed that the source current value is sufficiently small and the voltage $\Delta V$ can be ignored.

A voltage of the non-inverting input terminal of the calculation amplifier AMP, i.e., the connection node between the resistors R1 and R2, is $Vref-Vth\times(R1/(R1+R2))$, where R1 and R2 are respectively the resistance values of the resistors R1 and R2. For example, in a case where the voltage Vref is 1.0 [V], the threshold voltage Vth is −0.8 [V], and R1=R2, the voltage of the voltage supply line 111 is 1.4 [V]. This voltage is a voltage that corresponds to the voltage of the source in a case where a predetermined voltage is applied to the gate and drain of the P-type MOS transistor MP2 to change the state of the P-type MOS transistor MP2 to the on-state.

The N-type semiconductor region 14 of the photoelectric converter PD starts signal charge accumulation from a state where the potential of the N-type semiconductor region 14 is reset to the voltage Vref (=1.0 [V]). At this time point, a voltage VGS between the gate and source of the P-type MOS transistor MP1 is VGS=1.0 [V]−1.4 [V]=−0.4 [V]. Since the threshold voltage Vth of the P-type MOS transistor MP1 is Vth=−0.8 [V], the P-type MOS transistor MP1 is in the off-state. Thus, the gate capacitance of the P-type MOS transistor MP1 is small.

As described above, the potential of the N-type semiconductor region 14 decreases as the amount of signal charge accumulated in the N-type semiconductor region 14 increases. At this time, if the potential of the N-type semiconductor region 14 becomes lower than, for example, 0.6 V, i.e., if the voltage VGS between the gate and the source becomes lower than the threshold voltage Vth (=−0.8 V), the state of the P-type MOS transistor MP1 is changed to the on-state. Consequently, the gate capacitance of the P-type MOS transistor MP1 increases rapidly, and the saturation charge level of the photoelectric converter PD shows a sufficiently great value.

While the threshold voltage Vth of the MOS transistors is changed depending on variations in manufacturing conditions and operation temperature, effects of the change of the threshold voltage Vth are reduced by arranging the P-type MOS transistors MP1 and MP2 to have a similar configuration.

In place of the voltage supply circuit 110, for example, a power source configured to feed a fixed voltage of 1.4 V is connected to the voltage supply line 111. In this case, if the threshold voltage Vth of the P-type MOS transistor MP1 is changed by 0.1 V, the potential range within which the P-type MOS transistor MP1 is in the off-state is changed by 0.1 V. By using the voltage supply circuit 110 according to the present exemplary embodiment, the change in the potential range within which the P-type MOS transistor MP1 is in the off-state is reduced to 0.05 [V], which is a half of 0.1 [V].

Accordingly, with the present exemplary embodiment, a photoelectric conversion apparatus with an increased signal-to-noise (S/N) ratio and an increased dynamic range is realized.

Figure 13:
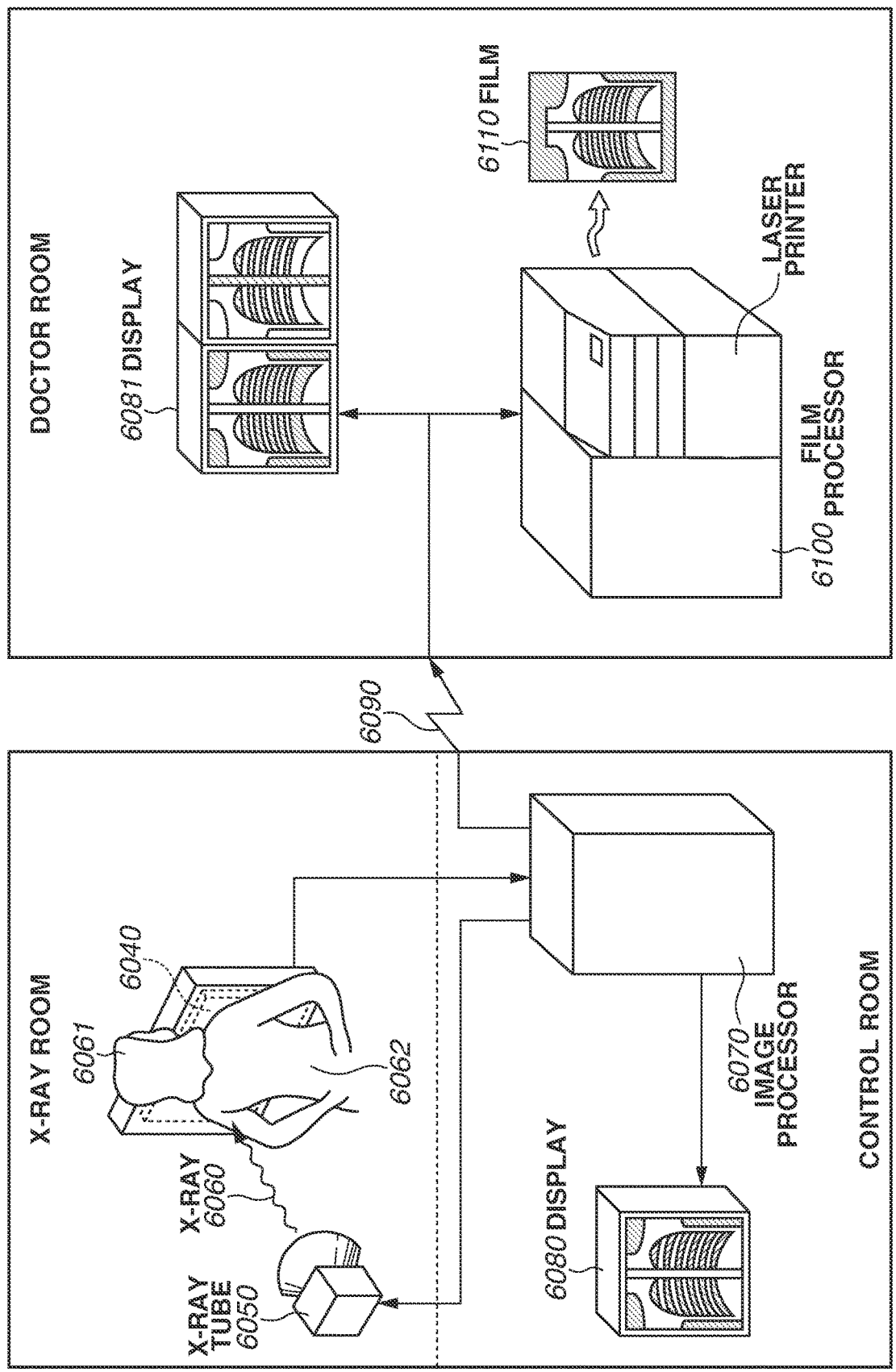
FIG. 13 illustrates an example of a configuration of a radiation image capturing system.

A fifth exemplary embodiment will be described below. FIG. 13 illustrates an example of an application of a photoelectric conversion apparatus according to the first to fourth exemplary embodiments to a radiation image capturing system.

The radiation image capturing system includes a radiation image capturing apparatus 6040 and an image processor 6070. The image processor 6070 processes a signal output from the radiation image capturing apparatus 6040. The radiation image capturing apparatus 6040 is a photoelectric conversion apparatus according to any of the above-described exemplary embodiments that is configured to capture a radiographic image. An X-ray 6060 generated by an X-ray tube (radiation source) 6050 transmits through a chest portion 6062 of a patient or examinee 6061 and enters the radiation image capturing apparatus 6040. The incident X-ray contains information about the inside of the body of the examinee 6061. The radiation image capturing apparatus 6040 includes a scintillator configured to convert a wavelength of an incident X-ray. The scintillator generally converts an X-ray into light of a wavelength in the visible light range. The radiation image capturing apparatus 6040 includes a photoelectric conversion apparatus according to any of the above-described exemplary embodiments, and visible light having a wavelength converted by the scintillator enters the photoelectric conversion apparatus. Thus, a signal charge corresponding to incident visible light from the scintillator is collected by the N-type semiconductor region 14 in the photoelectric conversion apparatus according to any of the exemplary embodiments.

The image processor (processor) 6070 processes a signal (image) output from the radiation image capturing apparatus 6040 and, for example, displays an image on a display 6080 in a control room based on an image signal acquired by the processing.

Furthermore, the image processor 6070 transfers a signal acquired through the processing to a remote place via a transmission path 6090. This makes it possible to display an image on a display 6081 located in a doctor room at another place and or record an image on a recording medium such as an optical disk. The recording medium can be a film 6110, and in this case, a film processor 6100 records an image on the film 6110.

The photoelectric conversion apparatus disclosed in the present specification is also applicable to an image capturing system configured to capture an image of visible light. Such an image capturing system can include, for example, a photoelectric conversion apparatus and a processor configured to process a signal output from the photoelectric conversion apparatus. The processing of the processor can include, for example, at least one of processing of converting an image format, processing of compressing an image, processing of changing the size of an image, and processing of changing the contrast of an image.

Figure 14:
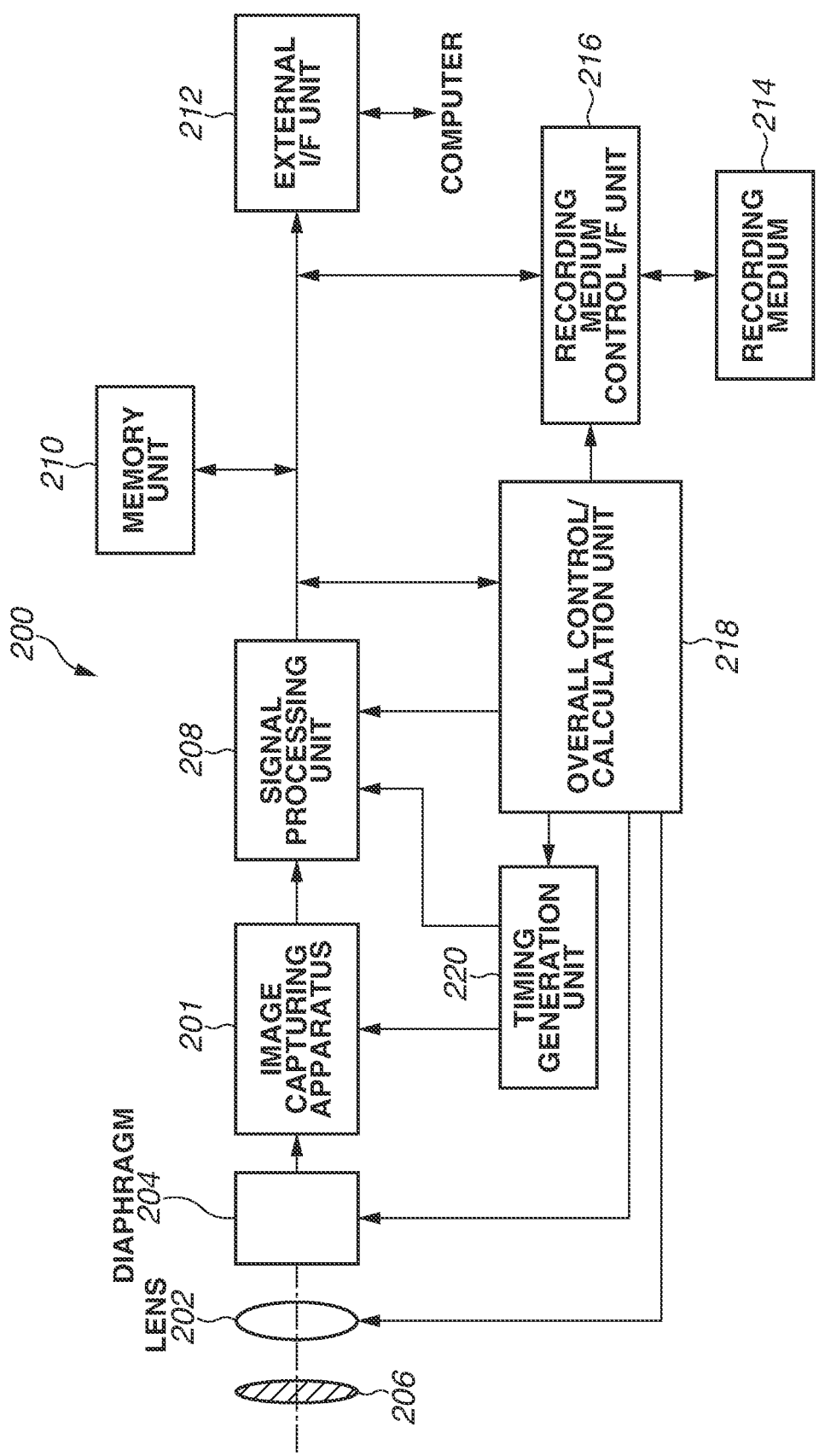
FIG. 14 illustrates an example of a configuration of a photoelectric conversion system.

A photoelectric conversion system according to a sixth exemplary embodiment will be described below with reference to FIG. 14. FIG. 14 is a block diagram illustrating a schematic configuration of the photoelectric conversion system according to the present exemplary embodiment.

The photoelectric conversion apparatuses according to the above-described exemplary embodiments are applicable to various photoelectric conversion systems. Examples of photoelectric conversion systems to which the photoelectric conversion apparatuses are applicable include digital still cameras, digital camcorders, monitoring cameras, copying machines, facsimile machines, mobile phones, in-vehicle cameras, and observation satellites. A camera module that includes an optical system, such as a lens, and an image capturing apparatus is also a photoelectric conversion system. In FIG. 14, a block diagram of a digital still camera is illustrated as an example.

The photoelectric conversion system illustrated as an example in FIG. 14 includes an image capturing apparatus 200, a lens 202, a diaphragm 204, and a barrier 206. The lens 202 forms an optical image of a subject on the image capturing apparatus 200. The diaphragm 204 changes the amount of light that transmits through the lens 202. The barrier 206 protects the lens 202. The lens 202 and the diaphragm 204 are an optical system configured to focus light onto the image capturing apparatus 200. The image capturing apparatus 200 is a photoelectric conversion apparatus based on any of the above-described exemplary embodiments and converts an optical image formed by the lens 202 into image data.

The photoelectric conversion system further includes a signal processing unit 208 configured to process a signal output from the image capturing apparatus 200. The signal processing unit 208 performs analog/digital (AD) conversion to convert an analog signal output from the image capturing apparatus 200 into a digital signal. The signal processing unit 208 also performs various types of correction and compression as needed and outputs image data. An AD conversion unit that is part of the signal processing unit 208 can be formed on a semiconductor substrate on which the image capturing apparatus 200 is formed or can be formed on another semiconductor substrate different from the semiconductor substrate on which the image capturing apparatus 200 is formed. Alternatively, the image capturing apparatus 200 and the signal processing unit 208 can be formed on the same semiconductor substrate.

The photoelectric conversion system further includes a memory unit 210 for temporarily storing image data and an external interface unit (external I/F unit) 212 for communicating with an external computer. The photoelectric conversion system further includes a recording medium 216, such as a semiconductor memory, for recording or reading captured data and a recording medium control interface unit (recording medium control I/F unit) 216 for recording on and reading from the recording medium 214. The recording medium 214 can be built in the photoelectric conversion system or can be removable and attachable.

The photoelectric conversion system further includes an overall control/calculation unit 218 and a timing generation unit 220. The overall control/calculation unit 218 controls various types of calculation and the entire digital still camera. The timing generation unit 220 outputs various timing signals to the image capturing apparatus 200 and the signal processing unit 208. Alternatively, the timing signals can externally be input, and the photoelectric conversion system is to include at least the image capturing apparatus 200 and the signal processing unit 208 configured to process the signal output from the image capturing apparatus 200.

The image capturing apparatus 200 outputs an image capturing signal to the signal processing unit 208. The signal processing unit 208 performs predetermined signal processing on the image capturing signal output from the image capturing apparatus 200 and outputs image data. The signal processing unit 208 generates an image using the image capturing signal.

As described above, according to the present exemplary embodiment, a photoelectric conversion system can be realized to which a photoelectric conversion apparatus is applied based on any of the above-described exemplary embodiments.

Figure 15A:
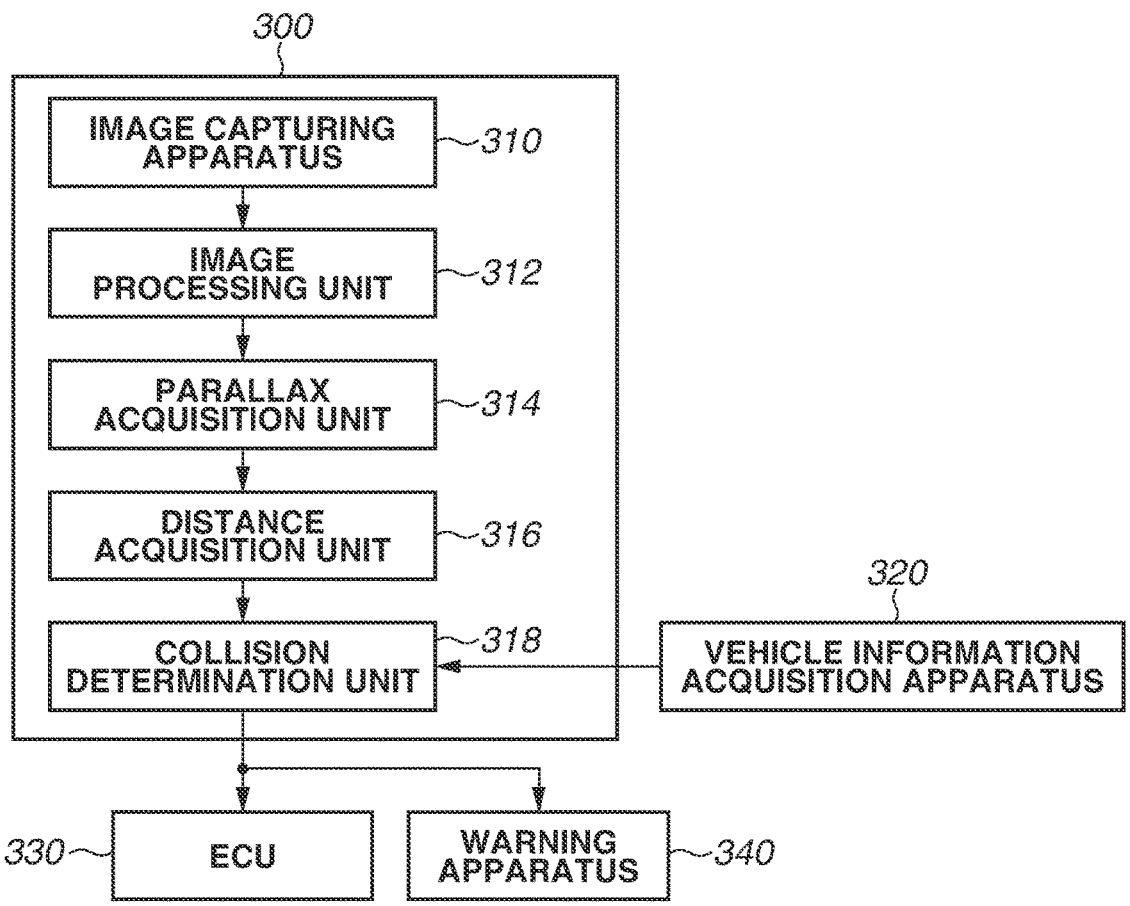
FIGS. 15A and 15B illustrate an example of a configuration of a moving object.
Figure 15B:
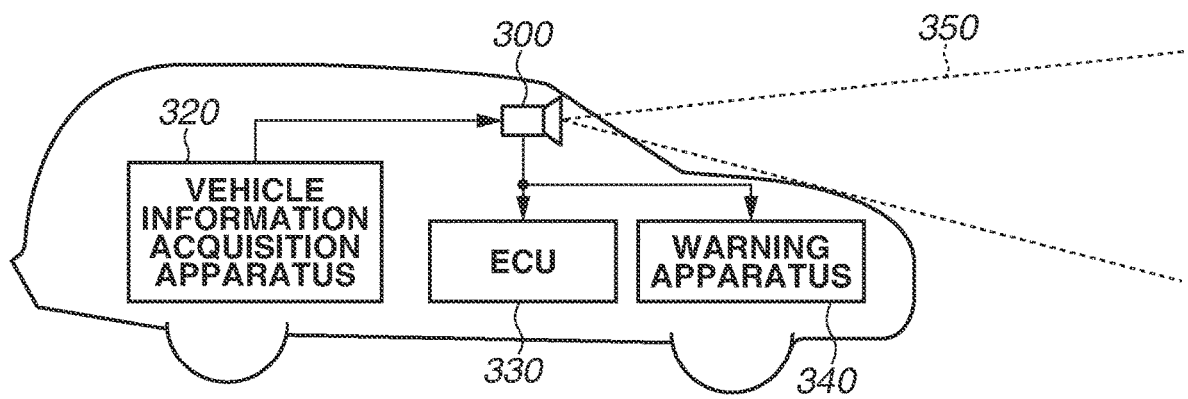

A photoelectric conversion system and a moving object according to a seventh exemplary embodiment will be described below with reference to FIGS. 15A and 15B. FIGS. 15A and 15B illustrate configurations of the photoelectric conversion system and the moving object according to the present exemplary embodiment.

FIG. 15A illustrates an example of the photoelectric conversion system that relates to an in-vehicle camera. A photoelectric conversion system 300 includes an image capturing apparatus 310. The image capturing apparatus 310 is a photoelectric conversion apparatus based on any of the above-described exemplary embodiments. The photoelectric conversion system 300 includes an image processing unit 312 and a parallax acquisition unit 314. The image processing unit 312 performs image processing on a plurality of pieces of image data acquired by the image capturing apparatus 310. The parallax acquisition unit 314 calculates a parallax (phase difference of parallax images) from the pieces of image data acquired by the photoelectric conversion system 300. The photoelectric conversion system 300 further includes a distance acquisition unit 316 and a collision determination unit 318. The distance acquisition unit 316 calculates the distance to a target object based on the calculated parallax. The collision determination unit 318 determines whether there is a possibility of a collision based on the calculated distance. The parallax acquisition unit 314 and the distance acquisition unit 316 are an example of a distance information acquisition unit that acquires distance information about the distance to a target object. Specifically, the distance information is information about a parallax, defocus amount, and the distance to a target object. The collision determination unit 318 can determine a possibility of a collision using any of the distance information. The distance information acquisition unit can be realized by dedicated hardware or by a software module. The distance information acquisition unit can also be realized by a field-programmable gate array (FPGA), an application-specific integrated circuit (ASIC), or a combination thereof.

The photoelectric conversion system 300 is connected to a vehicle information acquisition apparatus 320 and acquires vehicle information, such as a vehicle speed, yaw rate, and rudder angle. The photoelectric conversion system 300 is connected to an engine control unit (ECU) 330, which is a control apparatus configured to output a control signal for generating braking force with respect to the vehicle based on a result of the determination by the collision determination unit 318. The photoelectric conversion system 300 is also connected to a warning apparatus 340 configured to provide a warning to the driver based on the result of the determination by the collision determination unit 318. For example, in a case where the collision determination unit 318 determines that there is a high possibility of a collision, the control ECU 330 performs vehicle control to avoid collision or reduce damage by applying a brake, returning an accelerator, or reducing engine output. The warning apparatus 340 provides the warning to the user by sounding a warning such as a sound, displaying warning information on a screen such as a car navigation system, or vibrating a seat belt or steering.

In the present exemplary embodiment, an image of an area near the vehicle, such as a front or rear area, is captured by the photoelectric conversion system 300. FIG. 15B illustrates a photoelectric conversion system in a case where an image of a front area of the vehicle (image capturing range 350) is captured. The vehicle information acquisition apparatus 320 transmits an instruction to the photoelectric conversion system 300 or the image capturing apparatus 310. With this configuration, distance measurement accuracy is increased.

While the control of avoiding a collision with another vehicle is described above as an example, applications to the control for automatically driving to follow another vehicle and the control for automatically driving to not drive over a traffic lane are also possible. Furthermore, the photoelectric conversion system is applicable not only to a vehicle, such as a private vehicle, but also to a moving object (moving apparatus), such as a ship, aircraft, or industrial robot. The photoelectric conversion system is also applicable not only to a moving object but also to a wide range of devices that use object recognition, such as an intelligent transport system (ITS).

Modified Exemplary Embodiments

The present disclosure is not limited to the above-described exemplary embodiments, and various modifications can be made.

For example, an example in which part of a configuration based on any of the exemplary embodiments is added to another exemplary embodiment or replaced by part of a configuration based on another exemplary embodiment is also an exemplary embodiment of the present disclosure.

Further, each photoelectric conversion system according to the above-described exemplary embodiments is a mere example of a photoelectric conversion system to which a photoelectric conversion apparatus is applicable, and a configuration of a photoelectric conversion system to which a photoelectric conversion apparatus is applicable is not limited to those illustrated in FIGS. 14 and 15.

Each exemplary embodiment described above is a mere illustration of an example of implementation of the present disclosure and is not intended to limit interpretations of the technical scope of the disclosure. Specifically, the present disclosure can be implemented in various forms without departing from the technical concept or major features of the disclosure.

With the present disclosure, a technique for forming a well with an appropriate potential gradient can be realized while difficulties in a manufacturing process are avoided even in a case where the depth of the well is increased.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-145392, filed Aug. 7, 2019, which is hereby incorporated by reference herein in its entirety.

What is claimed is:

1. An apparatus provided with a converter on a semiconductor substrate including a first surface through which light enters, wherein the converter includes:
a first semiconductor region of a first conductivity type configured to collect a signal charge based on the light;
a well at a position deeper than the first semiconductor region when viewed from the first surface; and
a connection region of a second conductivity type extending through a part of a well region in a depth direction of the semiconductor substrate and configured to feed a predetermined potential to the well, the second conductivity type being opposite to the first conductivity type, wherein the well includes:
- a second semiconductor region of the second conductivity type at a depth to which the connection region extends;
- a third semiconductor region of the second conductivity type at a position deeper than the connection region and the second semiconductor region when viewed from the first surface; and
- a fourth semiconductor region located between the second semiconductor region and the third semiconductor region and including a greater amount of a dopant for use in forming a semiconductor region of the first conductivity type than an amount of a dopant for use in forming a semiconductor region of the second conductivity type;

a fifth semiconductor region of the second conductivity type at a position deeper than the third semiconductor region when viewed from the first surface, the fifth semiconductor region having a higher dopant density than a dopant density of the second semiconductor region and a dopant density of the third semiconductor region; and a sixth semiconductor region between the third semiconductor region and the fifth semiconductor region, wherein the dopant for use in forming the semiconductor region of the first conductivity type is injected in the sixth semiconductor region, wherein a width of the fourth semiconductor region in the depth direction of the semiconductor substrate is in the range from 0.8 times to 4 times a Debye length of the fourth semiconductor region, and wherein a width of the sixth semiconductor region in the depth direction of the semiconductor substrate is in the range from 0.8 times to 4 times a Debye length of the sixth semiconductor region.

2. The apparatus according to claim 1, further comprising:
a scintillator configured to convert radiation into visible light,
wherein a charge generated based on the visible light incident from the scintillator is collected by the first semiconductor region.

3. The apparatus according to claim 1, wherein the width of at least one of the fourth semiconductor region and the sixth semiconductor region in the depth direction of the semiconductor substrate is in the range from two times to three times the Debye length of the one of the fourth semiconductor region and the sixth semiconductor region.

4. The apparatus according to claim 3, wherein the width of the fourth semiconductor region in the depth direction of the semiconductor substrate is in the range from two times to three times the Debye length of the fourth semiconductor region, and the width of the sixth semiconductor region in the depth direction of the semiconductor substrate is in the range from two times to three times the Debye length of the sixth semiconductor region.

5. The apparatus according to claim 4,
wherein the connection region and a seventh semiconductor region of the first conductivity type at a position deeper than the first semiconductor region when viewed from the first surface, include a part of an eighth semiconductor region of the second conductivity type provided on the front surface portion of the semiconductor substrate and a part of a ninth semiconductor region of the second conductivity type at a position deeper than the seventh semiconductor region and the eighth semiconductor region, wherein the eighth semiconductor region and the ninth semiconductor region include a region that overlaps with the seventh semiconductor region in planar view, and wherein the seventh semiconductor region includes a trunk portion overlapping with the first semiconductor region in planar view and a plurality of branch portions extending from the trunk portion and overlapping with the eighth semiconductor region and the ninth semiconductor region in planar view.

6. The apparatus according to claim 5, further comprising:
a second conductivity type transistor including a gate connected to the first semiconductor region; and
a voltage supply circuit configured to feed a voltage to at least one of a source and a drain of the transistor,
wherein the voltage supply circuit feeds the voltage to at least one of the source and the drain so that when an amount of the signal charge accumulated in the first semiconductor region is a first accumulation amount, a gate capacitance of the transistor is a first capacitance, whereas when the amount of the signal charge accumulated in the first semiconductor region is a second accumulation amount which is greater than the first accumulation amount, the gate capacitance is a second capacitance which is greater than the first capacitance.

7. The apparatus according to claim 4, further comprising:
a transistor of the second conductivity type including a gate connected to the first semiconductor region; and
a voltage supply circuit configured to feed a voltage to at least one of a source and a drain of the transistor,
wherein the voltage supply circuit feeds the voltage to at least one of the source and the drain so that when an amount of the signal charge accumulated in the first semiconductor region is a first accumulation amount, a gate capacitance of the transistor is a first capacitance, whereas when the amount of the signal charge accumulated in the first semiconductor region is a second accumulation amount which is greater than the first accumulation amount, the gate capacitance is a second capacitance which is greater than the first capacitance.

8. The apparatus according to claim 1,
wherein the connection region and a seventh semiconductor region of the first conductivity type at a position deeper than the first semiconductor region when viewed from the first surface, include a part of an eighth semiconductor region of the second conductivity type provided on a front surface portion of the semiconductor substrate and a part of a ninth semiconductor region of the second conductivity type at a position deeper than the seventh semiconductor region and the eighth semiconductor region, wherein the eighth semiconductor region and the ninth semiconductor region include a region that overlaps with the seventh semiconductor region in planar view, and wherein the seventh semiconductor region includes a trunk portion overlapping with the first semiconductor region in planar view and a plurality of branch portions extending from the trunk portion and overlapping with the eighth semiconductor region and the ninth semiconductor region in planar view.

9. A system comprising:
the apparatus according to claim 1; and
a control apparatus configured to process an image signal acquired by the apparatus.

10. A system comprising:
the apparatus according to claim 1; and
a signal processing unit configured to process a signal output from the apparatus.

11. A moving object comprising:
the apparatus according to claim 1;
an acquisition unit configured to acquire information about a distance to a target object based on a parallax image based on a signal from the apparatus; and
a control unit configured to control the moving object based on the distance information.

12. The apparatus according to claim 1, wherein the connection region extends from the first semiconductor region through the part of well region.

13. An apparatus including a converter on a semiconductor substrate including a first surface from which light enters, wherein the converter includes:
a first semiconductor region of a first conductivity type configured to collect a signal charge based on the light;
a well at a position deeper than the first semiconductor region when viewed from the first surface; and
a connection region of a second conductivity type extending through a part of a well region in a depth direction of the semiconductor substrate and configured to feed a predetermined potential to the well, the second conductivity type being opposite to the first conductivity type,
wherein the well includes:
a second semiconductor region of the second conductivity type at a depth to which the connection region extends;
a third semiconductor region of the second conductivity type at a position deeper than the connection region and the second semiconductor region when viewed from the first surface; and
a fourth semiconductor region located between the second semiconductor region and the third semiconductor region and including a greater amount of a dopant for use in forming a semiconductor region of the first conductivity type than an amount of a dopant for use in forming a semiconductor region of the second conductivity type,
wherein a main carrier of the fourth semiconductor region is a carrier of the same conductivity type as a majority carrier of the semiconductor region of the second conductivity type,
wherein the connection region and a seventh semiconductor region of the first conductivity type at a position deeper than the first semiconductor region when viewed from the first surface, include a part of an eighth semiconductor region of the second conductivity type provided on a front surface portion of the semiconductor substrate and a part of a ninth semiconductor region of the second conductivity type provided at a position deeper than the seventh semiconductor region and the eighth semiconductor region,
wherein the eighth semiconductor region and the ninth semiconductor region include a region that overlaps with the seventh semiconductor region in planar view, and
wherein the seventh semiconductor region includes a trunk portion overlapping with the first semiconductor region in planar view and a plurality of branch portions extending from the trunk portion and overlapping with the eighth semiconductor region and the ninth semiconductor region in planar view.

14. The apparatus according to claim 13, further comprising:
a scintillator configured to convert radiation into visible light,
wherein a charge generated based on the visible light incident from the scintillator is collected by the first semiconductor region.

15. The apparatus according to claim 13, further comprising:
a transistor of the second conductivity type including a gate connected to the first semiconductor region; and
a voltage supply circuit configured to feed a voltage to at least one of a source and a drain of the transistor,
wherein the voltage supply circuit feeds the voltage to at least one of the source and the drain so that when an amount of the signal charge accumulated in the first semiconductor region is a first accumulation amount, a gate capacitance of the transistor is a first capacitance, whereas when the amount of the signal charge accumulated in the first semiconductor region is a second accumulation amount which is greater than the first accumulation amount, the gate capacitance is a second capacitance which is greater than the first capacitance.

16. A system comprising:
the apparatus according to claim 13; and
a control apparatus configured to process an image signal acquired by the apparatus.

17. A system comprising:
the apparatus according to claim 13; and
a signal processing unit configured to process a signal output from the apparatus.

18. A moving object comprising:
the apparatus according to claim 13;
an acquisition unit configured to acquire information about a distance to a target object based on a parallax image based on a signal from the apparatus; and
a control unit configured to control the moving object based on the distance information.

19. The apparatus according to claim 13, wherein the connection region extends from the first semiconductor region through the part of well region.

20. An apparatus provided with a converter on a semiconductor substrate including a first surface through which light enters,
wherein the converter includes:
a first semiconductor region of a first conductivity type configured to collect a signal charge based on the light;
a well at a position deeper than the first semiconductor region when viewed from the first surface; and
a connection region of a second conductivity type extending through a part of a well region in a depth direction of the semiconductor substrate and configured to feed a predetermined potential to the well, the second conductivity type being opposite to the first conductivity type,
wherein the well includes:
a second semiconductor region of the second conductivity type at a depth to which the connection region extends;
a third semiconductor region of the second conductivity type at a position deeper than the connection region and the second semiconductor region when viewed from the first surface; and
a fourth semiconductor region located between the second semiconductor region and the third semiconductor region and including a greater amount of a dopant for use in forming a semiconductor region of the first conductivity type than an amount of a dopant for use in forming a semiconductor region of the second conductivity type, wherein a width of the fourth semiconductor region in the depth direction of the semiconductor substrate is in the range from 0.8 times to 4 times a Debye length of the fourth semiconductor region, wherein the connection region and a seventh semiconductor region of the first conductivity type at a position deeper than the first semiconductor region when viewed from the first surface, include a part of an eighth semiconductor region of the second conductivity type provided on a front surface portion of the semiconductor substrate and a part of a ninth semiconductor region of the second conductivity type at a position deeper than the seventh semiconductor region and the eighth semiconductor region, wherein the eighth semiconductor region and the ninth semiconductor region include a region that overlaps with the seventh semiconductor region in planar view, and wherein the seventh semiconductor region includes a trunk portion overlapping with the first semiconductor region in planar view and a plurality of branch portions extending from the trunk portion and overlapping with the eighth semiconductor region and the ninth semiconductor region in planar view.

21. The apparatus according to claim 20, further comprising a scintillator configured to convert radiation into visible light, wherein a charge generated based on the visible light incident from the scintillator is collected by the first semiconductor region.

22. A system comprising:
the apparatus according to claim 20; and
a signal processing unit configured to process a signal output from the apparatus.

23. The apparatus according to claim 20, wherein the connection region extends from the first semiconductor region through the part of well region.

24. An apparatus comprising:
a converter on a semiconductor substrate including a first surface from which light enters,
wherein the converter includes:
a first semiconductor region of a first conductivity type configured to collect a signal charge based on the light;
a well at a position deeper than the first semiconductor region when viewed from the first surface; and
a connection region of a second conductivity type extending through a part of a well region in a depth direction of the semiconductor substrate and configured to feed a predetermined potential to the well, the second conductivity type being opposite to the first conductivity type,
wherein the well includes:
a second semiconductor region of the second conductivity type at a depth to which the connection region extends;
a third semiconductor region of the second conductivity type at a position deeper than the connection region and the second semiconductor region when viewed from the first surface;
a fourth semiconductor region located between the second semiconductor region and the third semiconductor region and including a greater amount of a dopant for use in forming a semiconductor region of the first conductivity type than an amount of a dopant for use in forming a semiconductor region of the second conductivity type, wherein a main carrier of the fourth semiconductor region is a carrier of the same conductivity type as a majority carrier of the semiconductor region of the second conductivity type;

a transistor of the second conductivity type including a gate connected to the first semiconductor region; and a voltage supply circuit configured to feed a voltage to at least one of a source and a drain of the transistor, wherein the voltage supply circuit feeds the voltage to at least one of the source and the drain so that when an amount of the signal charge accumulated in the first semiconductor region is a first accumulation amount, a gate capacitance of the transistor is a first capacitance, whereas when the amount of the signal charge accumulated in the first semiconductor region is a second accumulation amount which is greater than the first accumulation amount, the gate capacitance is a second capacitance which is greater than the first capacitance.

25. The apparatus according to claim 24, further comprising a scintillator configured to convert radiation into visible light, wherein a charge generated based on the visible light incident from the scintillator is collected by the first semiconductor region.

26. A system comprising:
the apparatus according to claim 24; and
a signal processing unit configured to process a signal output from the apparatus.

27. The apparatus according to claim 24, wherein the connection region extends from the first semiconductor region through the part of well region.

28. An apparatus provided with a converter on a semiconductor substrate including:
a first surface through which light enters,
wherein the converter includes:
a first semiconductor region of a first conductivity type configured to collect a signal charge based on the light;
a well at a position deeper than the first semiconductor region when viewed from the first surface; and
a connection region of a second conductivity type extending through a part of a well region in a depth direction of the semiconductor substrate and configured to feed a predetermined potential to the well, the second conductivity type being opposite to the first conductivity type,
wherein the well includes:
a second semiconductor region of the second conductivity type at a depth to which the connection region extends;
a third semiconductor region of the second conductivity type at a position deeper than the connection region and the second semiconductor region when viewed from the first surface; and
a fourth semiconductor region located between the second semiconductor region and the third semiconductor region and including a greater amount of a dopant for use in forming a semiconductor region of the first conductivity type than an amount of a dopant for use in forming a semiconductor region of the second conductivity type, wherein a width of the fourth semiconductor region in the depth direction of the semiconductor substrate is in the range from 0.8 times to 4 times a Debye length of the fourth semiconductor region;

a transistor of the second conductivity type including a gate connected to the first semiconductor region; and a voltage supply circuit configured to feed a voltage to at least one of a source and a drain of the transistor, wherein the voltage supply circuit feeds the voltage to at least one of the source and the drain so that when an amount of the signal charge accumulated in the first semiconductor region is a first accumulation amount, a gate capacitance of the transistor is a first capacitance, whereas when the amount of the signal charge accumulated in the first semiconductor region is a second accumulation amount which is greater than the first accumulation amount, the gate capacitance is a second capacitance which is greater than the first capacitance.

29. The apparatus according to claim 28, further comprising a scintillator configured to convert radiation into visible light, wherein a charge generated based on the visible light incident from the scintillator is collected by the first semiconductor region.

30. A system comprising:

the apparatus according to claim 28; and a signal processing unit configured to process a signal output from the apparatus.

31. The apparatus according to claim 28, wherein the connection region extends from the first semiconductor region through the part of well region.

* * * * *